(12) United States Patent
Ma et al.

(10) Patent No.: US 12,375,065 B2
(45) Date of Patent: Jul. 29, 2025

(54) BAND PASS FILTER CIRCUIT AND SENSOR DEVICE INCLUDING THE SAME

(71) Applicant: SAMSUNG DISPLAY CO., LTD., Yongin-si (KR)

(72) Inventors: Hyung Gun Ma, Yongin-si (KR); Dong Kyu Lee, Yongin-si (KR); Ji Woong Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 92 days.

(21) Appl. No.: 18/502,145

(22) Filed: Nov. 6, 2023

(65) Prior Publication Data
US 2024/0250664 A1 Jul. 25, 2024

(30) Foreign Application Priority Data
Jan. 3, 2023 (KR) .......................... 10-2023-0000524

(51) Int. Cl.
*G06F 3/044* (2006.01)
*G06F 3/041* (2006.01)
*H03H 11/12* (2006.01)

(52) U.S. Cl.
CPC ........... *H03H 11/12* (2013.01); *G06F 3/0418* (2013.01); *G06F 3/0446* (2019.05)

(58) Field of Classification Search
CPC .... H03H 11/12; H03H 19/004; H03H 7/0161; H03H 7/12; H03H 11/0427; G06F 3/0418; G06F 3/044; G06F 3/0446; H03K 17/962
See application file for complete search history.

(56) References Cited

U.S. PATENT DOCUMENTS 6,172,631 B1 * 1/2001 Tsai ...................... H03M 3/342
  341/143
9,639,733 B2   5/2017 Kremin et al.
(Continued)

FOREIGN PATENT DOCUMENTS

KR   10-2020-0080791      7/2020
KR   10-2198854           1/2021
(Continued)

OTHER PUBLICATIONS

Baschirotto, et al., "BiCMOS Switched-Capacitor Linear-Phase Bandpass Filter for RDS applications", ESSCIRC 90: Sixteenth European Solid-State Circuits Conference, Sep. 19-21, 1990, pp. 185-188.
(Continued)

*Primary Examiner* — Sanghyuk Park
(74) *Attorney, Agent, or Firm* — F. CHAU & ASSOCIATES, LLC

(57) ABSTRACT

A band pass filter circuit includes an amplifier circuit having a first input terminal to receive a first analog signal; a second input terminal to receive a second analog signal; first and second output terminals; capacitors; and switches. In a first switching mode, the switches are controlled so that the amplifier circuit and a first group of the capacitors connected between the input and output terminals operate as a first band pass filter filtering the first and second analog signals in a differential mode. In a second switching mode, the switches are controlled so that the amplifier circuit and second and third groups of the capacitors form second band pass filters filtering each of the first and second analog signals in a single-ended mode.

20 Claims, 20 Drawing Sheets

(56) References Cited

U.S. PATENT DOCUMENTS

| | | |
|---|---|---|
| 9,704,936 B2 | 7/2017 | Chae et al. |
| 9,898,149 B2 | 2/2018 | Kang et al. |
| 11,360,620 B2 | 6/2022 | Kim et al. |
| 2010/0308935 A1* | 12/2010 | Visconti ............... H03H 11/126 333/173 |
| 2021/0049951 A1* | 2/2021 | Amirkhany .......... G09G 3/3275 |
| 2023/0280869 A1 | 9/2023 | Jeong |

FOREIGN PATENT DOCUMENTS

| | | |
|---|---|---|
| KR | 10-2324765 | 11/2021 |
| KR | 10-2023-0126309 | 8/2023 |

OTHER PUBLICATIONS

Chiappano, et al., "A Tunable Switched-Capacitor Programmable N-Path Tone Receiver and Generator", IEEE Journal of Solid-State Circuits, vol. 23, No. 6, Dec. 1988, pp. 1418-1425.

Palmisano, et al., "Performance Comparisons of Pseudo-N-Path SC Cells in Filters With Real Operational Amplifier", IEEE International Symposium on Circuits and Systems (ISCAS), vol. 2, May 8-11, 1989, pp. 1467-1470.

Palmisano, et al., "Simplified Pseudo-N-Path Cells for z to -zN transformed SC Active Filters", IEEE Transactions on Circuits and Systems, vol. 36, No. 3, Mar. 1989, pp. 461-463.

\* cited by examiner

BAND PASS FILTER CIRCUIT AND SENSOR DEVICE INCLUDING THE SAME

CROSS-REFERENCE TO RELATED APPLICATION

The application claims priority to and the benefit of Korean Patent Application No. 10-2023-0000524, filed Jan. 3, 2023, which is hereby incorporated by reference for all purposes as if fully set forth herein.

FIELD

This disclosure relates generally to a band pass filter circuit and a sensor device including the same. This disclosure also relates to a switched capacitor integrator for sampling analog signals.

DISCUSSION OF RELATED ART

As information technology has developed, the importance of a display device, which is a connection medium between a user and information, has been emphasized. Some examples of today's display devices liquid crystal display devices and organic light emitting display (OLED) devices.

A touchscreen display device may include a display panel for displaying an image and a sensor device overlaying the display panel for sensing a user's input. The sensor device may include filters such as band pass filters for obtaining signals of a desired frequency band from sensing signals.

SUMMARY

In embodiments of the inventive concept, a touch input can be sensed with improved reliability by using different types of band pass filters according to the type of object providing a touch input in a sensor device.

A band pass filter circuit according to embodiments of the present inventive concept and a sensor device including the same can provide different types of band pass filters in a reduced area. For example, the band pass filter circuit may support two types of band pass filters. The two types of band pass filters may share one or more of capacitors included in the band pass filter circuit. Accordingly, the two types of band pass filters may have a reduced area.

A band pass filter circuit according to embodiments of the present inventive concept may include an amplifier circuit having a first input terminal to receive a first analog signal, a second input terminal to receive a second analog signal, and first and second output terminals; a plurality of capacitors; and switches connected to the plurality of capacitors. The switches are controlled in a first switching mode connect, among the plurality of capacitors, a first group of capacitors between the first and second input terminals and the first and second output terminals, to form in conjunction with the amplifier circuit a first band pass filter that filters the first and second analog signals in a differential mode. The switches are controlled in a second switching mode to connect, among the plurality of capacitors, a second group of capacitors between the first input terminal and the first output terminal and a third group of capacitors connected between the second input terminal and the second output terminal, such that the amplifier circuit, the second group of capacitors, and the third group of capacitors form second band pass filters to filter each of the first and second analog signals in a single-ended mode.

The second band pass filters may be configured to share one or more of the plurality of capacitors with the first band pass filter.

At least one of the second group of capacitors and at least one of the third group of capacitors may be included in the first group of capacitors.

The amplifier circuit and the second group of capacitors may be included in one of the second band pass filters to filter the first analog signal. The amplifier circuit and the third group of capacitors may be included in another one of the second band pass filters to filter the second analog signal.

The amplifier circuit may include the first input terminal as an inverting input terminal, the second input terminal as a non-inverting input terminal, the first output terminal as a non-inverting output terminal, and the second output terminal as an inverting output terminal.

The plurality of capacitors may include a first gain capacitor connected between the first input terminal and the first output terminal; and a second gain capacitor connected between the second input terminal and the second output terminal.

The band pass filter circuit may further include first input capacitors connected in series to the first input terminal; and second input capacitors connected in series to the second input terminal. The first analog signal may be transmitted to the first input terminal through the first input capacitors, and the second analog signal may be transmitted to the second input terminal through the second input capacitors.

In the second band pass filters, each of first and second capacitors among the second group of capacitors may be configured to alternately perform integration on the first analog signal and output a first sampling signal. The first capacitor may be connected to the second capacitor through a first connection node when performing the integration on the first analog signal, and may be configured to perform integration of charges of the second capacitor together with the first analog signal and output the first sampling signal.

In the second band pass filters, the second capacitor may be connected to the first capacitor through the first connection node when performing the integration on the first analog signal, and may be configured to perform integration of charges of the first capacitor together with the first analog signal and output the first sampling signal.

In the second band pass filters, each of third and fourth capacitors among the third group of capacitors may be configured to alternately perform integration on the second analog signal and output a second sampling signal. The third capacitor may be connected to the fourth capacitor through a second connection node when performing the integration on the second analog signal, and may be configured to perform integration of charges of the fourth capacitor together with the second analog signal and output the second sampling signal.

In the second band pass filters, the fourth capacitor may be connected to the third capacitor through the second connection node when performing the integration on the second analog signal, and may be configured to perform integration of charges of the third capacitor together with the second analog signal and output the second sampling signal.

In the first band pass filter, a first capacitor among the first group of capacitors may be configured to perform integration on the first analog signal and output a first sampling signal through the first output terminal. A second capacitor among the first group of capacitors may be connected to the first capacitor through a first connection node and configured to store charges of the first capacitor.

In the first band pass filter, when the first capacitor performs the integration on the first analog signal, the second capacitor may be connected to a third capacitor among the first group of capacitors through a second connection node. The third capacitor may be configured to perform integration of charges of the second capacitor together with the second analog signal and output a second sampling signal through the second output terminal.

Another aspect of the present invention relates to a sensor device. The sensor device may include a sensor array; and a sensor driver including a band pass filter circuit to filter first and second analog signals received from the sensor array. The band pass filter circuit may include an amplifier circuit having a first input terminal receiving the first analog signal, a second input terminal receiving the second analog signal, a first output terminal, and a second output terminal; a plurality of capacitors; and switches connected to the plurality of capacitors. The switches are controlled in a first switching mode to connect, as among the plurality of capacitors, a first group of capacitors between the first and second input terminals and the first and second output terminals, to form in conjunction with the amplifier circuit a first band pass filter to filter the first and second analog signals in a differential mode. The switches are controlled in a second switching mode to connect, among the plurality of capacitors, a second group of capacitors between the first input terminal and the first output terminal and a third group of capacitors between the second input terminal and the second output terminal, such that the amplifier circuit, the second group of capacitors, and the third group of capacitors form second band pass filters to filter each of the first and second analog signals in a single-ended mode.

The sensor driver may be configured to operate the band pass filter circuit as the first band pass filter by controlling the switches to sense a touch input of a body (an animal body part, e.g., a human finger) based on the first and second analog signals. The sensor driver may be configured to operate the band pass filter circuit as the second band pass filters by controlling the switches to sense a touch input of a pen based on the first and second analog signals.

The second band pass filters may be configured to share one or more of the plurality of capacitors with the first band pass filter.

At least one of the second group of capacitors and at least one of the third group of capacitors may be included in the first group of capacitors.

The amplifier circuit and the second group of capacitors may be included in one of the second band pass filters and configured to filter the first analog signal. The amplifier circuit and the third group of capacitors may be included in another one of the second band pass filters and configured to filter the second analog signal.

In another aspect, a switched capacitor integrator circuit for sampling analog input signals includes: an operational amplifier having a first input terminal to receive a first analog signal, a second input terminal to receive a second analog signal, and first and second output terminals; a plurality of capacitors; and switches connected to the plurality of capacitors. The switches are controlled in a first switching mode to connect, among the plurality of capacitors, a first group of capacitors between the first and second input terminals and the first and second output terminals, to form in conjunction with the operational amplifier a first filter that filters the first and second analog signals in a differential mode. The switches are controlled in a second switching mode to connect, among the plurality of capacitors, a second group of capacitors between the first input terminal and the first output terminal and a third group of capacitors between the second input terminal and the second output terminal, such that the operational amplifier, the second group of capacitors, and the third group of capacitors form second filters to filter each of the first and second analog signals in a single-ended mode.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF EMBODIMENTS

Hereinafter, embodiments according to the present disclosure will be described in detail with reference to the accompanying drawings. It should be noted that in the following description, only parts necessary for understanding the operation according to the present disclosure are described, and descriptions of other parts will be omitted to avoid obscuring the subject matter of the present disclosure. In addition, the present disclosure is not limited to the embodiments described herein and may be embodied in other forms. However, the embodiments described herein are provided to explain in detail so that those skilled in the art can readily practice the technical spirit of the present disclosure.

Throughout the specification, when a first part is said to be connected or coupled to a second part, this includes not only a case where the first part and the second part are directly connected or coupled, but also a case where they are indirectly connected or coupled by another element interposed between them. Terms used herein are for describing specific embodiments and are not intended to limit the present disclosure. Throughout the specification, when a part includes a certain component, unless the context clearly indicates otherwise, this means that it may further include other components rather than excluding other components. At least one of X, Y, and Z, and at least one selected from the group consisting of X, Y, and Z may be construed as one X, one Y, one Z, or any combination of two or more of X, Y, and Z (for example, XYZ, XYY, YZ, and ZZ). As used herein, the term "and/or" may include any combination of one or more of the corresponding elements.

Although the terms "first", "second", etc. may be used herein to describe various elements, these elements should not be limited by these terms. These terms are only used to distinguish one element from another element. Thus, a first element discussed below could be termed a second element without departing from the scope of the present disclosure.

Herein, when a first circuit element is said to be "connected" to a second circuit element, the connection may be a direct connection without an intervening component (e.g., the first and second circuit elements are connected to a common node in a schematic diagram), or an indirect connection in which an intervening circuit element is present between the first and second circuit elements.

Herein, the term "gain capacitor" refers to a capacitor that affects the gain of a circuit within which the capacitor is part of. A gain capacitor may be an "integration capacitor" in a switched capacitor integrator.

Figure 1:
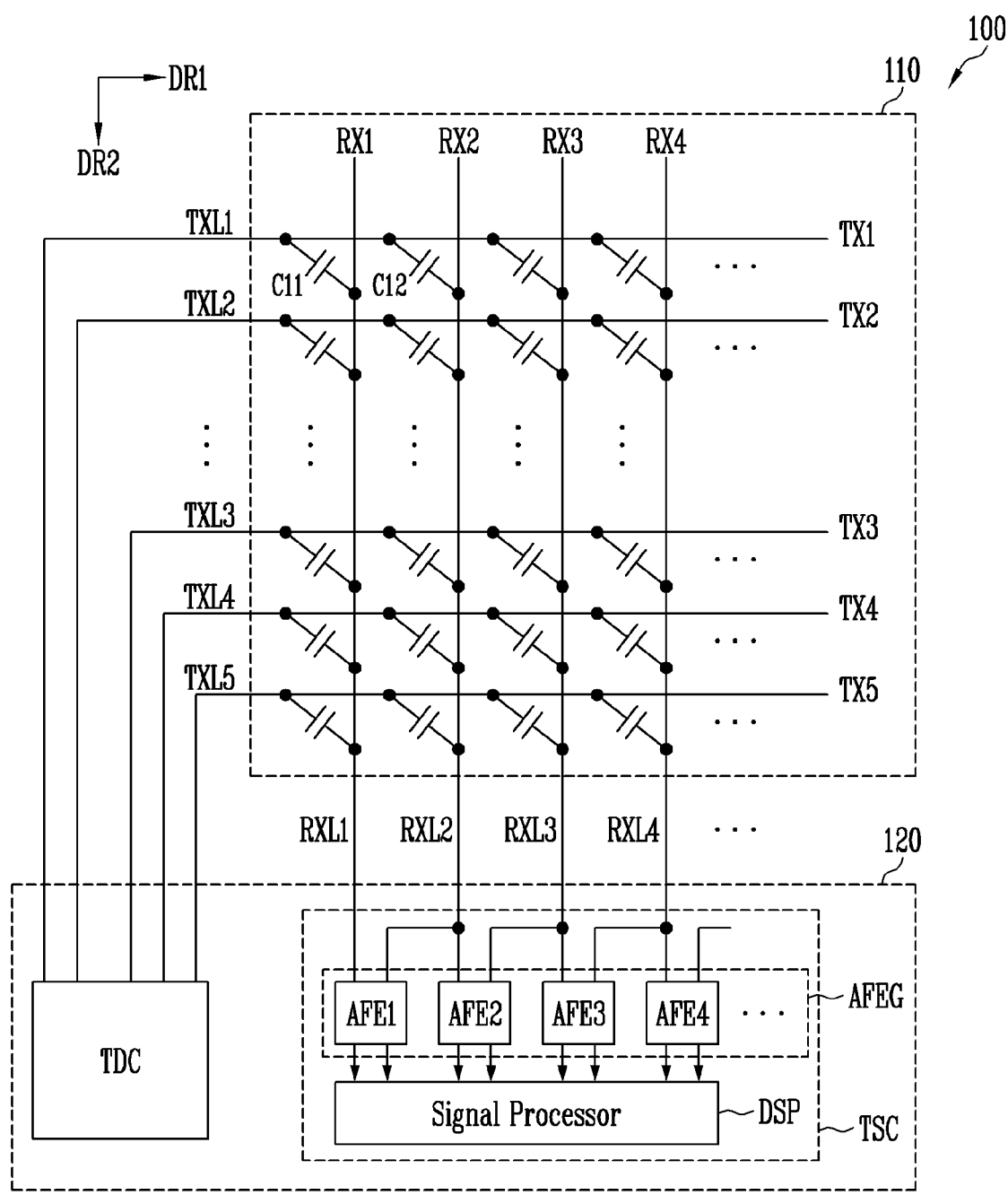
FIG. 1 is a block diagram illustrating an embodiment of a sensor device according to the present inventive concept.

FIG. 1 is a block diagram illustrating an embodiment of a sensor device according to the present inventive concept.

Referring to FIG. 1, a sensor device 100 may include a sensor array 110 and a sensor driver 120.

The sensor array 110 may include first sensors TX1, TX2, TX3, TX4, and TX5 and second sensors RX1, RX2, RX3, and RX4. The first sensors TX1 to TX5 may extend in a first direction DR1 and may be arranged in a second direction DR2 crossing the first direction DR1. The second sensors RX1 to RX4 may extend in the second direction DR2 and may be arranged in the first direction DR1. The second sensors RX1 to RX4 may intersect the first sensors TX1 to TX5. The first sensors TX1 to TX5 and the second sensors RX1 to RX4 may form mutual capacitance. For example, capacitance C11 may be formed between a first sensor TX1 and a second sensor RX1, and capacitance C12 may be formed between the first sensor TX1 and the second sensor RX2.

The sensor driver 120 may sense a user's touch input by detecting such a change in capacitance. The sensor driver 120 may include a sensor transmitter TDC and a sensor receiver TSC. The sensor transmitter TDC may be connected to the first sensors TX1 to TX5 and may supply driving signals to the first sensors TX1 to TX5. The sensor transmitter TDC may be connected to the first sensors TX1 to TX5 through first sensor lines TXL1, TXL2, TXL3, TXL4, and TXL5.

The sensor receiver TSC may be connected to the second sensors RX1 to RX4 and may receive sensing signals from the second sensors RX1 to RX4. The sensing signals may be analog signals. The sensor receiver TSC may be connected to the second sensors RX1 to RX4 through second sensor lines RXL1, RXL2, RXL3, and RXL4. The sensor receiver TSC may include an analog front end group AFEG and a signal processor DSP.

The analog front end group AFEG may include a plurality of analog front ends AFE1, AFE2, AFE3, and AFE4. Each of the analog front ends AFE1 to AFE4 may be connected to two neighboring ones of the second sensors RX1 to RX4. For example, a first analog front end AFE1 may be connected to the second sensors RX1 and RX2. A second analog front end AFE2 may be connected to the second sensors RX2 and RX3. A third analog front end AFE3 may be connected to the second sensors RX3 and RX4. A fourth analog front end AFE4 may be connected to the second sensor RX4 and the second sensor adjacent thereto.

Each of the analog front ends AFE1 to AFE4 may operate in a fully differential mode. In the fully differential mode, each analog front end may process sensing signals of adjacent second sensors into differential signals to generate a common signal of the sensing signals and a digital signal from which common noise is removed. In this case, the signal to noise ratio (SNR) can be improved. In some embodiments, in order to sense a touch input of a body (an animal body part, e.g., a human finger) adjacent to the sensor array 110, the analog front ends AFE1 to AFE4 may operate in the fully differential mode.

For example, in the fully differential mode (which may correspond to a first switching mode controlling switching states of switches within the analog front ends AFE1 to AFE4), the first analog front end AFE1 may out a digital signal corresponding to a value obtained by subtracting the level of a sensing signal of the second sensor RX2 from the level of a sensing signal of the second sensor RX1 and a digital signal corresponding to a value obtained by subtracting the level of the sensing signal of the second sensor RX1 from the level of the sensing signal of the second sensor RX2 to the signal processor DSP. The second analog front end AFE2 may output a digital signal corresponding to a value obtained by subtracting the level of the sensing signal of the second sensor RX2 from the level of a sensing signal of the second sensor RX3 and a digital signal corresponding to a value obtained by subtracting the level of the sensing signal of the second sensor RX3 from the level of the sensing signal of the second sensor RX2 to the signal processor DSP. As such, in the fully differential mode, each analog front end may output relative values between neighboring sensing signals.

Each of the analog front ends AFE1 to AFE4 may operate in a single-ended mode (which may correspond to a second switching mode controlling switching states of switches within the analog front ends AFE1 to AFE4). In the single-ended mode, each analog front end may generate digital signals by independently processing each of the received sensing signals. In this case, the digital signals may reflect magnitudes of the sensing signals. In some embodiments, to sense a touch input of a pen adjacent to the sensor array 110, the analog front ends AFE1 to AFE4 may operate in the single-ended mode. Since the touch input area of a pen is typically smaller than that of a finger, it is desirable to implement a touch input detection scheme with higher resolution for touch inputs with a pen as opposed to a finger. In other examples, it may be desirable to allow a user to select (e.g., through a suitable user interface) between low and high touch input detection resolutions, even for finger-based touch inputs.

Thus, to achieve higher touch input detection resolution, for example, in the single-ended mode, the first analog front end AFE1 may output a digital signal corresponding to the level of the sensing signal of the second sensor RX1 and a digital signal corresponding to the level of the sensing signal of the second sensor RX2 to the signal processor DSP. The second analog front end AFE2 may output a digital signal corresponding to the level of the sensing signal of the second sensor RX2 and a digital signal corresponding to the level of the sensing signal of the second sensor RX3 to the signal processor DSP. Each output digital signal may reflect the magnitude (or level) of the corresponding sensing signal.

The signal processor DSP may calculate sensing values using the digital signals provided by the analog front end group AFEG, and may sense the touch input according to the sensing values.

Figure 2:
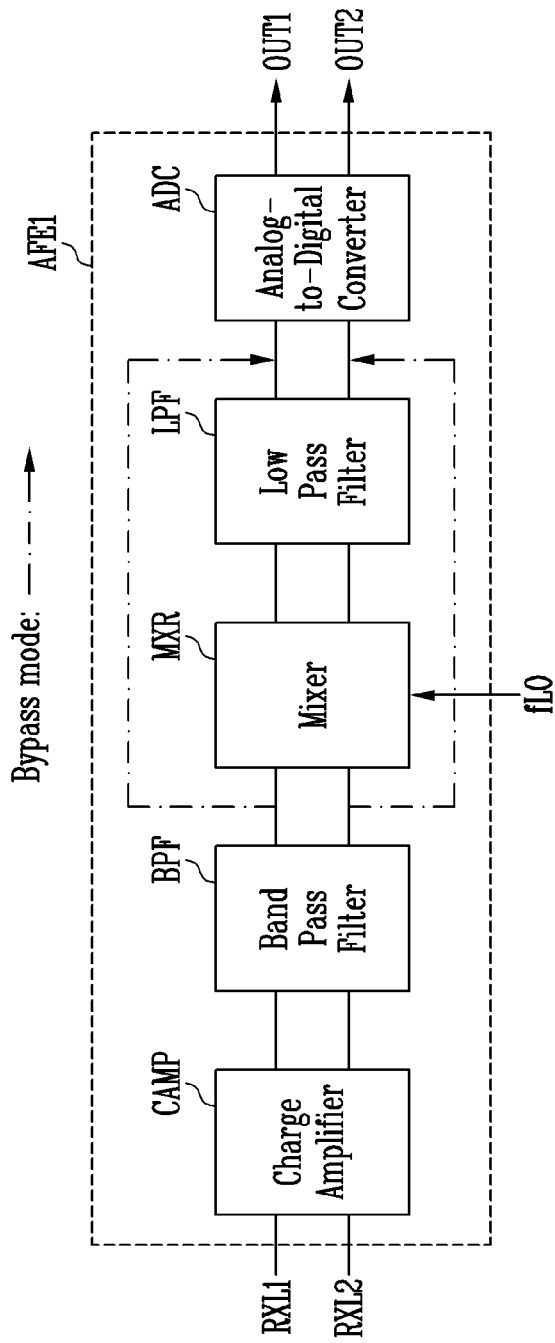
FIG. 2 is a block diagram illustrating an embodiment of any one of analog front ends of FIG. 1.

FIG. 2 is a block diagram illustrating an embodiment of any one of analog front ends of FIG. 1.

Referring to FIG. 2, the first analog front end AFE1 may include a charge amplifier CAMP, a band pass filter BPF, a mixer MXR, a low pass filter LPF, and an analog-to-digital converter ADC. The second to fourth analog front ends AFE2 to AFE4 may be configured similarly to the first analog front end AFE1 except for the second sensors. Hereinafter, redundant descriptions will be omitted.

The charge amplifier CAMP may be configured to receive the sensing signals from the second sensors RX1 and RX2 through the second sensor lines RXL1 and RXL2, and transfer the received sensing signals to the band pass filter BPF. In some embodiment, the charge amplifier CAMP may operate in the fully differential mode and output a signal corresponding to a difference between the level of the sensing signal of the second sensor RX2 and the level of the sensing signal of the second sensor RX1, and an inverted signal thereof. In some embodiment, the charge amplifier CAMP may operate in the single-ended mode and output a signal corresponding to the level of the sensing signal of the second sensor RX1 and a signal corresponding to the level of the sensing signal of the second sensor RX2.

The charge amplifier CAMP, the band pass filter BPF, the mixer MXR, the low pass filter LPF, and the analog-to-digital converter ADC may constitute sequentially connected stages. In FIG. 2, each of the band pass filter BPF, the mixer MXR, the low pass filter LPF, and the analog-to-digital converter ADC is shown connected to a previous stage through two internal signals. In the fully differential mode, each stage may receive and process an input signal and an inverted signal of the input signal through two internal signal lines. In this case, each stage may have an advantage of being able to remove noise commonly included in the input signal and the inverted signal. In the single-ended mode, each stage may receive and process an input signal corresponding to the sensing signal of the second sensor line RXL1 and an input signal corresponding to the sensing signal of the second sensor line RXL2 through two internal signal lines. In this case, each stage may independently process each input signal to provide an output signal reflecting the magnitude of the input signal.

The band pass filter BPF may be connected to output terminals of the charge amplifier CAMP. The band pass filter BPF may be configured to filter output signals of the charge amplifier CAMP by sampling the output signals at a specific frequency. The band pass filter BPF may filter the output signals to have a predetermined frequency band. For example, a frequency band may be preset to include a frequency (or center frequency) of the sensing signals, and noise components may be located outside the frequency band. The center frequency of the sensing signals may be the same as a center frequency of the driving signals.

According to an embodiment of the present inventive concept, the band pass filter BPF may include a dual mode band pass filter supporting the fully differential mode and the single-ended mode.

The mixer MXR may be connected to output terminals of the band pass filter BPF. The mixer MXR may mix output signals of the band pass filter BPF and a local clock signal fLO. The mixer MXR may generate output signals including frequency components corresponding to a difference and/or sum of the frequency of the output signals and the frequency of the local clock signal fLO. For example, when the frequency of the output signals of the band pass filter BPF and the frequency of the local clock signal fLO are the same, an output signal of the mixer MXR may include a frequency component having 0 Hz as a center frequency.

The low pass filter LPF may filter output signals of the mixer MXR to have a predetermined frequency band. In this case, a predetermined frequency band of the low pass filter LPF may be lower than a predetermined frequency band of the band pass filter BPF. For example, the low pass filter LPF may pass only signals of a low frequency band centered on 0 Hz among the output signals of the mixer MXR. Accordingly, the low pass filter LPF may filter frequency components corresponding to noise.

The analog-to-digital converter ADC may be connected to output terminals of the low pass filter LPF. The analog-to-digital converter ADC may convert output signals of the low pass filter LPF into digital signals OUT1 and OUT2. In the fully differential mode, the digital signals OUT1 and OUT2 may be understood as corresponding to a signal corresponding to a difference between the level of the sensing signal of the second sensor RX2 and the level of the sensing signal of the second sensor RX1, and an inverted signal thereof, respectively. In the single-ended mode, the digital signals OUT1 and OUT2 may be understood as corresponding to the sensing signal of the second sensor line RXL1 and the sensing signal of the second sensor line RXL2, respectively.

The analog-to-digital converter ADC may receive a signal of a low frequency band from the low pass filter LPF. Therefore, the analog-to-digital converter ADC may operate at a low sampling rate and have a low frequency clock signal, which can be advantageous in terms of power and configuration costs.

The signal processor DSP of FIG. 1 may sense a touch input according to the digital signals OUT1 and OUT2. The digital signals OUT1 and OUT2 received in the fully differential mode may be advantageous for sensing a touch input of a body (for example, a finger). The digital signals OUT1 and OUT2 received in the single-ended mode may be advantageous for sensing a touch input of a pen.

In some embodiments, the sensor receiver TSC may operate in a bypass mode. In this case, functions of the mixer MXR and the low pass filter LPF may be performed digitally in the signal processor DSP. In this case, the output signals of the band pass filter BPF may be directly transferred to the analog-to-digital converter ADC.

Figure 3:
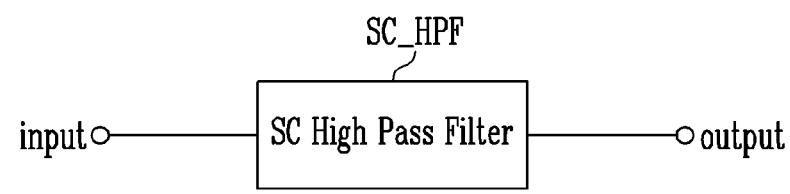
FIGS. 3 and 4 are diagrams for explaining advantages of implementing a band pass filter with high pass filters.
Figure 3:
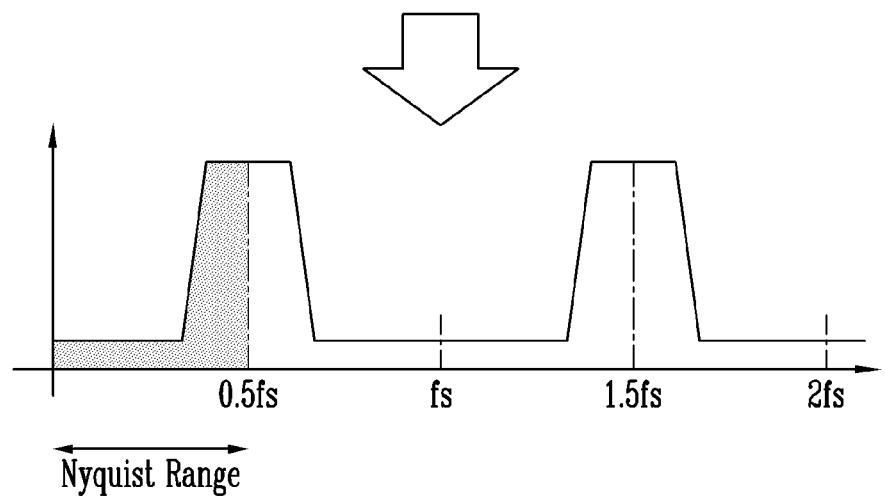
Figure 4:
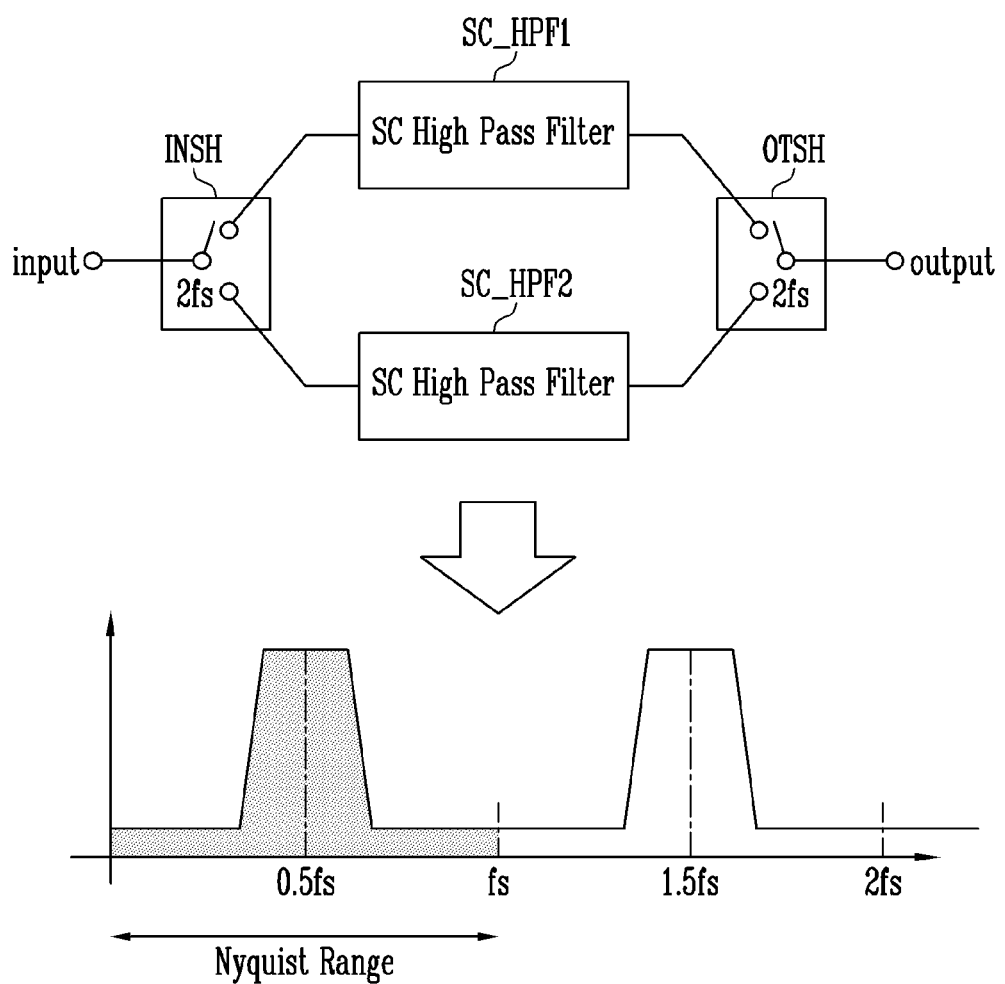

FIGS. 3 and 4 are diagrams for explaining advantages of implementing a band pass filter with high pass filters.

Referring to FIG. 3, characteristics of one switched-capacitor (SC) high pass filter SC_HPF are shown. As is well known, a maximum value (0.5 fs) of the Nyquist Range of the SC high pass filter SC_HPF may correspond to ½ of a sampling frequency (fs) of the SC high pass filter SC_HPF.

In other words, the SC high pass filter SC_HPF may have a pass band having the maximum value (0.5 fs) of the Nyquist Range as a center frequency.

Referring to FIG. 4, considering the Nyquist range, to implement a band pass filter having a pass band of the center frequency (0.5 fs), two SC high pass filters SC_HPF1 and SC_HPF2 connected in parallel may be provided.

Considering the sampling frequency (fs) of each of the SC high pass filters SC_HPF1 and SC_HPF2, a frequency (2 fs) of an input switch INSH and a frequency (2 fs) of an output switch OTSH need to be twice the sampling frequency (fs) to accurately sample and reconstruct analog signals including frequencies of interest without losing information. In this case, even if the sampling frequency (fs) of a clock signal provided to each of the SC high pass filters SC_HPF1 and SC_HPF2 is the same, phases will be different.

A band pass filter may be implemented using two SC high pass filters SC_HPF1 and SC_HPF2. Hereinafter, embodiments of a band pass filter implemented with high pass filters will be described with reference to FIGS. 5 to 19.

Figure 5:
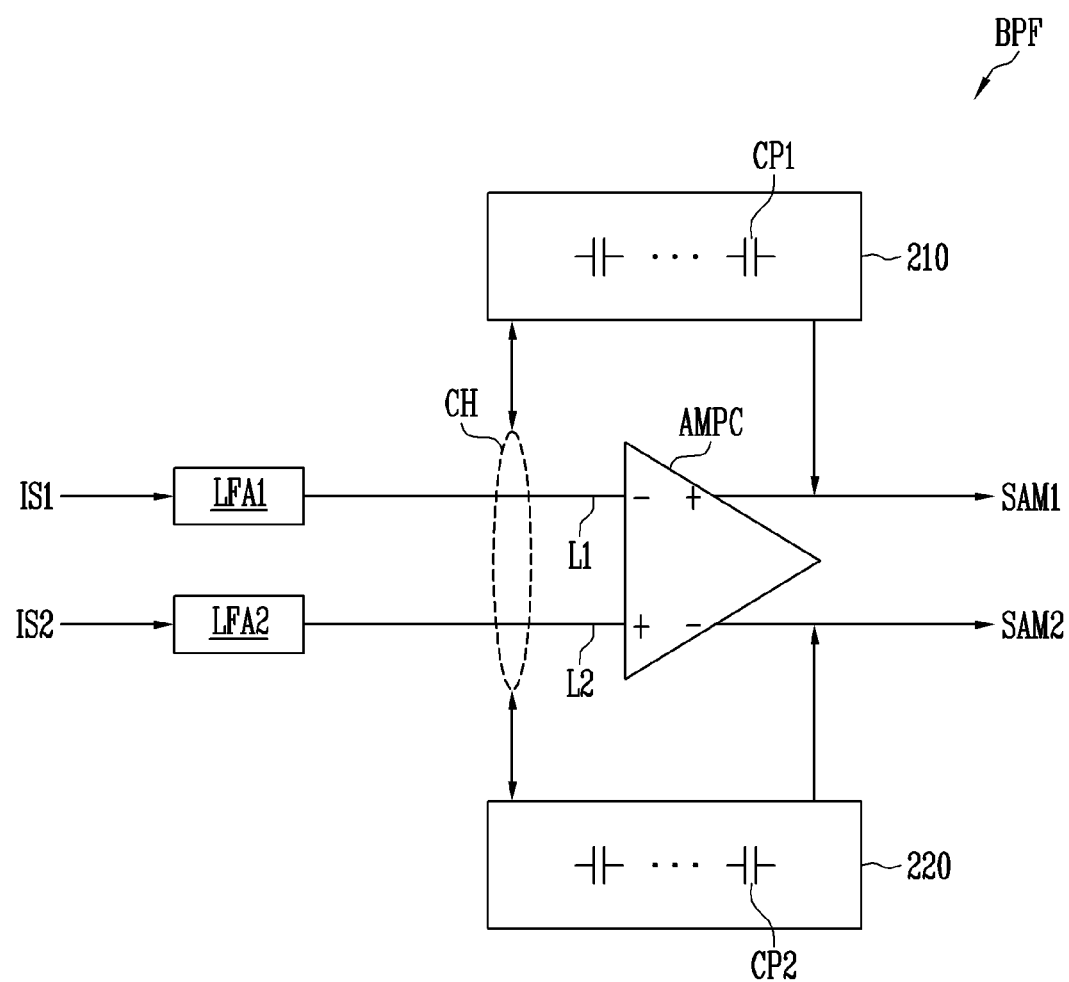
FIG. 5 is a block diagram illustrating an embodiment of a band pass filter of FIG. 2.

FIG. 5 is a high level schematic diagram illustrating an embodiment of a band pass filter of FIG. 2.

Referring to FIG. 5, the band pass filter BPF may include first and second low frequency attenuation units LFA1 and LFA2, a first capacitor circuit 210, a second capacitor circuit 220, and an amplifier circuit AMPC.

The first low frequency attenuation unit LFA1 may be configured to attenuate the low frequency component of a first input signal IS1 and output it to a first line L1. The second low frequency attenuation unit LFA2 may be configured to attenuate the low frequency component of a second input signal IS2 and output it to a second line L2. For example, environmental noise associated with the sensor device may cause low frequency components of the first and second input signals IS1 and IS2. The low frequency components of the first and second input signals IS1 and IS2 may be attenuated while passing through the first and second low frequency attenuation units LFA1 and LFA2.

The amplifier circuit AMPC may have an inverting input terminal connected to the first line L1 and a non-inverting input terminal connected to the second line L2. One example of the amplifier circuit AMPC is an operational amplifier (op amp), albeit other implementations may be available. A first sampling signal SAM1 (e.g., a sample and hold signal) may be output through a non-inverting output terminal of the amplifier circuit AMPC, and a second sampling signal SAM2 (e.g., a sample and hold signal) may be output through an inverting output terminal of the amplifier circuit AMPC.

The amplifier circuit AMPC may be selectively operated as a fully differential amplifier in a first switching mode, and a single-ended amplifier in a second switching mode, in response to control signals applied to switches (examples of which are shown later) within the band pass filter BPF and/or within the first and second capacitor circuits 210 and 220.

The first capacitor circuit 210 may include first capacitors CP1. The second capacitor circuit 220 may include second capacitors CP2. The first and second capacitor circuits 210 and 220 may be connected to the first and second lines L1 and L2 through a channel CH. (Embodiments of the channel CH will be described later.) The channel CH may be connected between the first and second low frequency attenuation units LFA1 and LFA2 and the first and second lines L1 and L2. By transmitting control signals to switches included in the band pass filter BPF and/or the first and second capacitor circuits 210 and 220, the electrical connection relationship between the first capacitors CP1, the second capacitors CP2, and the amplifier circuit AMPC may be changed in various ways.

The first capacitor circuit 210 may be connected to the non-inverting output terminal of the amplifier circuit AMPC. The second capacitor circuit 220 may be connected to the inverting output terminal of the amplifier circuit AMPC. The current and/or voltage output through the first capacitor circuit 210 (indicated schematically by the arrow output from first capacitor circuit 210 to the non-inverting output terminal of amplifier circuit AMPC) may be output as the first sampling signal SAM1. Likewise, the current and/or voltage output through the second capacitor circuit 220 may be output as the second sampling signal SAM2.

Figure 6A:
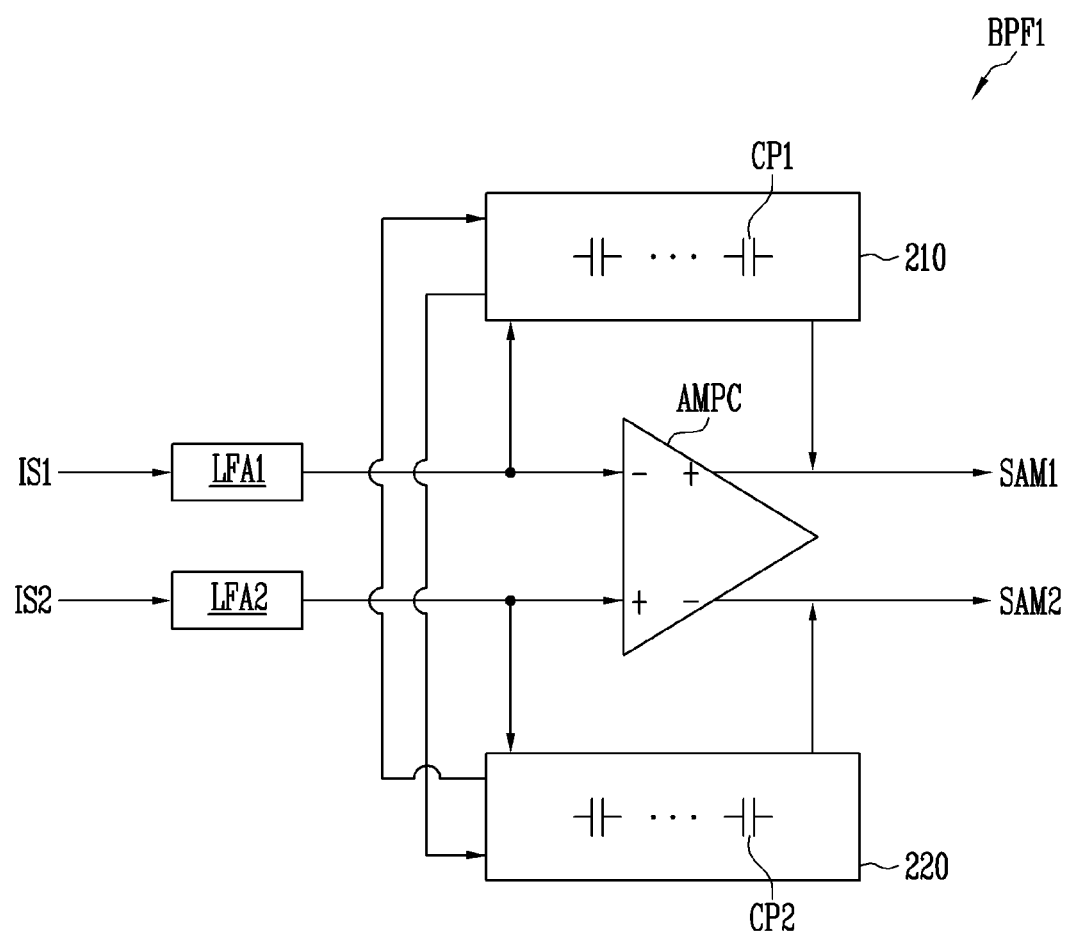
FIG. 6A is a block diagram illustrating an embodiment of a band pass filter operating in a fully differential mode converted from the band pass filter of FIG. 5.

FIG. 6A is a block diagram illustrating an embodiment of a band pass filter operating in a fully differential mode converted from the band pass filter of FIG. 5.

Referring to FIG. 6A, at least some of the first capacitors CP1 may perform integration for a sampling operation (to achieve a sampled output) on the first input signal IS1 passing through the first low frequency attenuation unit LFA1. In addition, at least some of the first capacitors CP1 may be connected to at least some of the second capacitors CP2 through the channel CH of FIG. 5 to transfer charges.

At least some of the second capacitors CP2 receiving charges from the first capacitor circuit 210 may perform integration (or sampling) on the second input signal IS2 passing through the second low frequency attenuation unit LFA2. Accordingly, the second input signal IS2 may be integrated with charges stored in at least some of the first capacitors CP1 according to the first input signal IS1. Accordingly, the second sampling signal SAM2 may be output from the second capacitor circuit 220. As such, at least some of the first capacitors CP1, at least some of the second capacitors CP2, and the amplifier circuit AMPC may function as a z to −z transformed SC integrator or high pass filter for the second input signal IS2 using the first input signal IS1 as a differential signal.

At least some of the second capacitors CP2 may be connected to at least some of the first capacitors CP1 through the channel CH of FIG. 5 to transfer charges. At least some of the first capacitors CP1 receiving charges from the second capacitor circuit 220 may perform integration on the first input signal IS1. Accordingly, the first input signal IS1 may be integrated with charges stored in at least some of the second capacitors CP2 according to the second input signal IS2. Accordingly, the first sampling signal SAM1 may be output from the first capacitor circuit 210. As such, at least some of the first capacitors CP1, at least some of the second capacitors CP2, and the amplifier circuit AMPC may function as a z to −z transformed SC integrator or high pass filter for the first input signal IS1 using the second input signal IS2 as a differential signal.

Accordingly, the first and second low frequency attenuation units LFA1 and LFA2, at least some of the first capacitors CP1, at least some of the second capacitors CP2, and the amplifier circuit AMPC may constitute a band pass filter BPF1 operating in the fully differential mode.

In some embodiments, when the band pass filter BPF of FIG. 5 operates as the fully differential mode band pass filter BPF1, the amplifier circuit AMPC may operate as a fully differential mode amplifier.

Figure 6B:
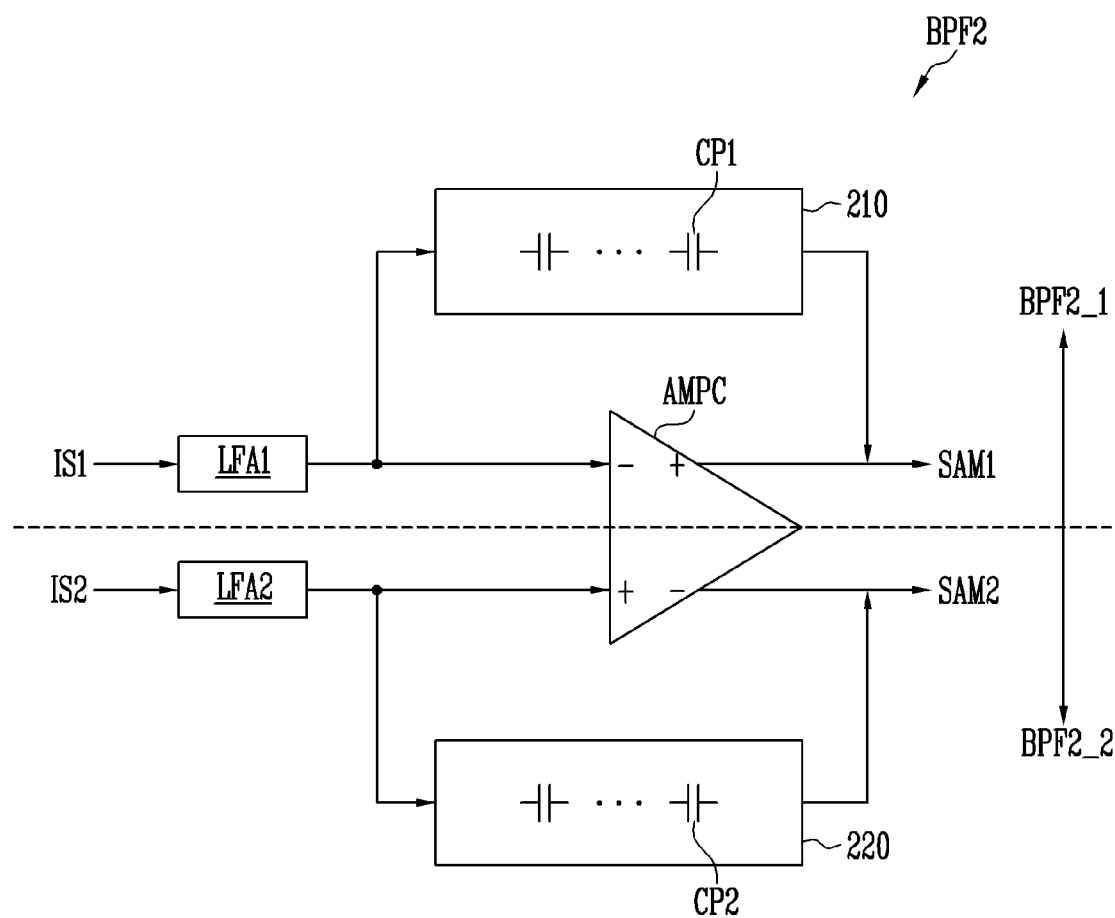
FIG. 6B is a block diagram illustrating an embodiment of a band pass filter operating in a single-ended mode converted from the band pass filter of FIG. 5.

FIG. 6B is a block diagram illustrating an embodiment of a band pass filter operating in a single-ended mode converted from the band pass filter of FIG. 5.

Referring to FIG. 6B, a band pass filter BPF2 operating in the single-ended mode may include two single-ended mode band pass filter circuits BPF2_1 and BPF2_2 operating independently of each other. The band pass filter circuits BPF2_1 and BPF2_2 may not communicate with each other and may operate independently of each other.

At least some of the first capacitors CP1 and the amplifier circuit AMPC may operate as at least two z to −z transformed SC integrators or high pass filters. For example, third capacitors among the first capacitors CP1 and the amplifier circuit AMPC may function as one z to −z transformed SC integrator or high pass filter to output the first sampling signal SAM1. Fourth capacitors among the first capacitors CP1 and the amplifier circuit AMPC may function as another z to −z transformed SC integrator or high pass filter to output the first sampling signal SAM1. In this case, the third capacitors may be different from the fourth capacitors. Alternatively, at least some of the third capacitors may be included in the fourth capacitors. Accordingly, the first low frequency attenuation unit LFA1, at least some of the first capacitors CP1, and the amplifier circuit AMPC may constitute the single-ended mode first band pass filter circuit BPF2_1 that outputs the first sampling signal SAM1 by filtering the first input signal IS1.

At least some of the second capacitors CP2 and the amplifier circuit AMPC may function as at least two z to −z transformed SC integrators or high pass filters. For example, fifth capacitors among the second capacitors CP2 and the amplifier circuit AMPC may function as one z to −z transformed SC integrator or high pass filter to output the second sampling signal SAM2. Sixth capacitors among the second capacitors CP2 and the amplifier circuit AMPC may function as another z to −z transformed SC integrator or high pass filter to output the second sampling signal SAM2. In this case, the fifth capacitors may be different from the sixth capacitors. Alternatively, at least some of the fifth capacitors may be included in the sixth capacitors. Accordingly, the second low frequency attenuation unit LFA2, at least some of the second capacitors CP2, and the amplifier circuit AMPC may institute the single-ended mode second band pass filter circuit BPF2_2 that outputs the second sampling signal SAM2 by filtering the second input signal IS2.

In some embodiments, when the band pass filter BPF of FIG. 5 operates as the single-ended mode first and second band pass filter circuits BPF2_1 and BPF2_2, the amplifier circuit AMPC may operate as first and second single-ended amplifiers operating independently of each other. The first single-ended amplifier may have an inverting input terminal receiving the first input signal IS1, a non-inverting input terminal receiving a reference voltage, and a single-ended output terminal outputting the first sampling signal SAM1. The second single-ended amplifier may have an inverting input terminal receiving the second input signal IS2, a non-inverting input terminal receiving the reference voltage, and a single-ended output terminal outputting the second sampling signal SAM2.

As such, the band pass filter BPF of FIG. 5 may be converted into a fully differential mode band pass filter that receives the first and second input signals IS1 and IS2 as differential signals and performs sampling, and a single-ended mode band pass filter that independently samples each of the first and second input signals IS1 and IS2. Accordingly, compared to the case of separately providing a fully differential mode band pass filter and a single-ended mode band pass filter, the band pass filter BPF (refer to FIG. 2) having a reduced area may be provided. Accordingly, the sensor device 100 (refer to FIG. 1) having a reduced area can be provided.

Figure 7:
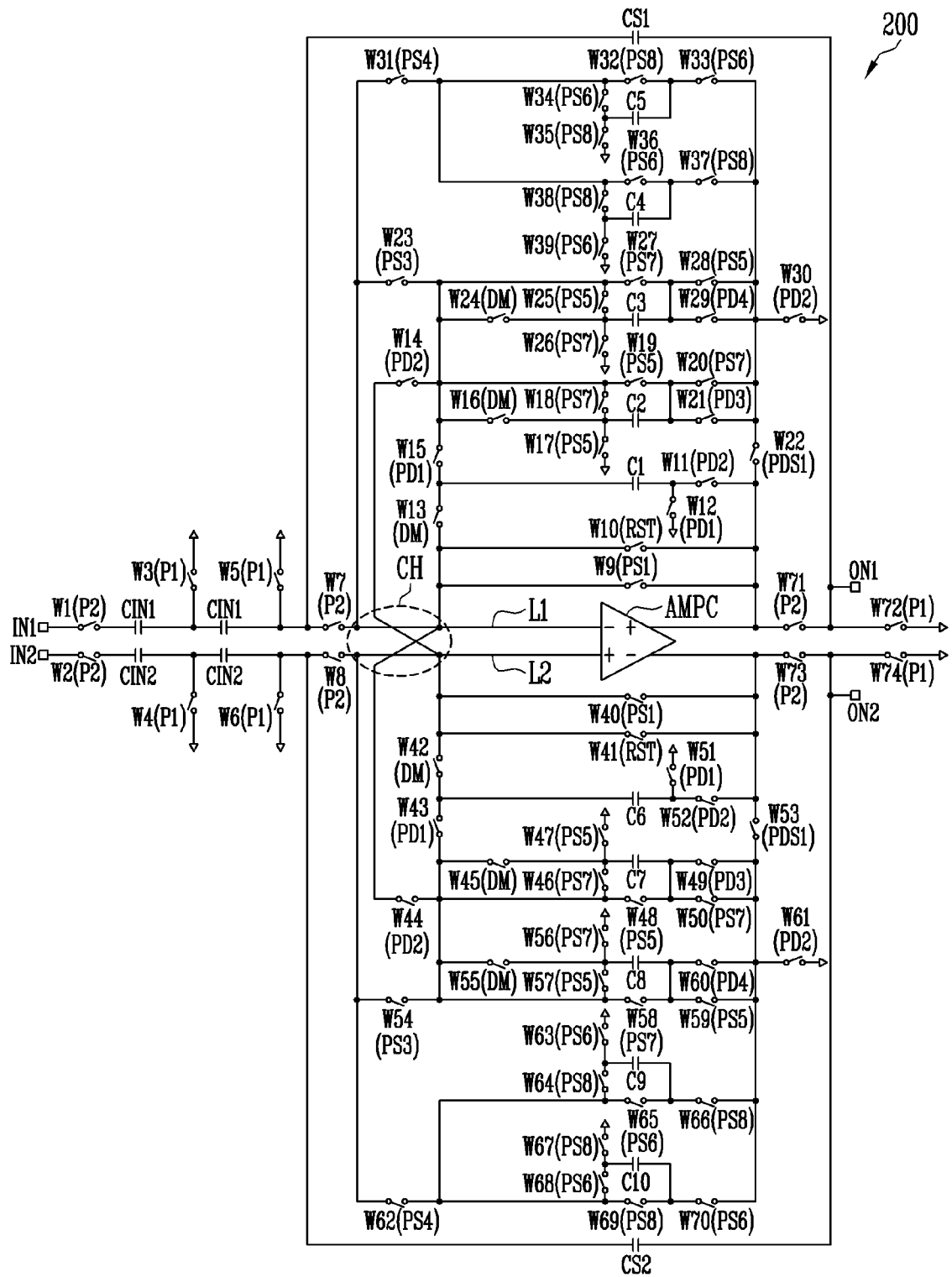
FIG. 7 is a circuit diagram illustrating an embodiment of the band pass filter of FIG. 5.
Figure 8:
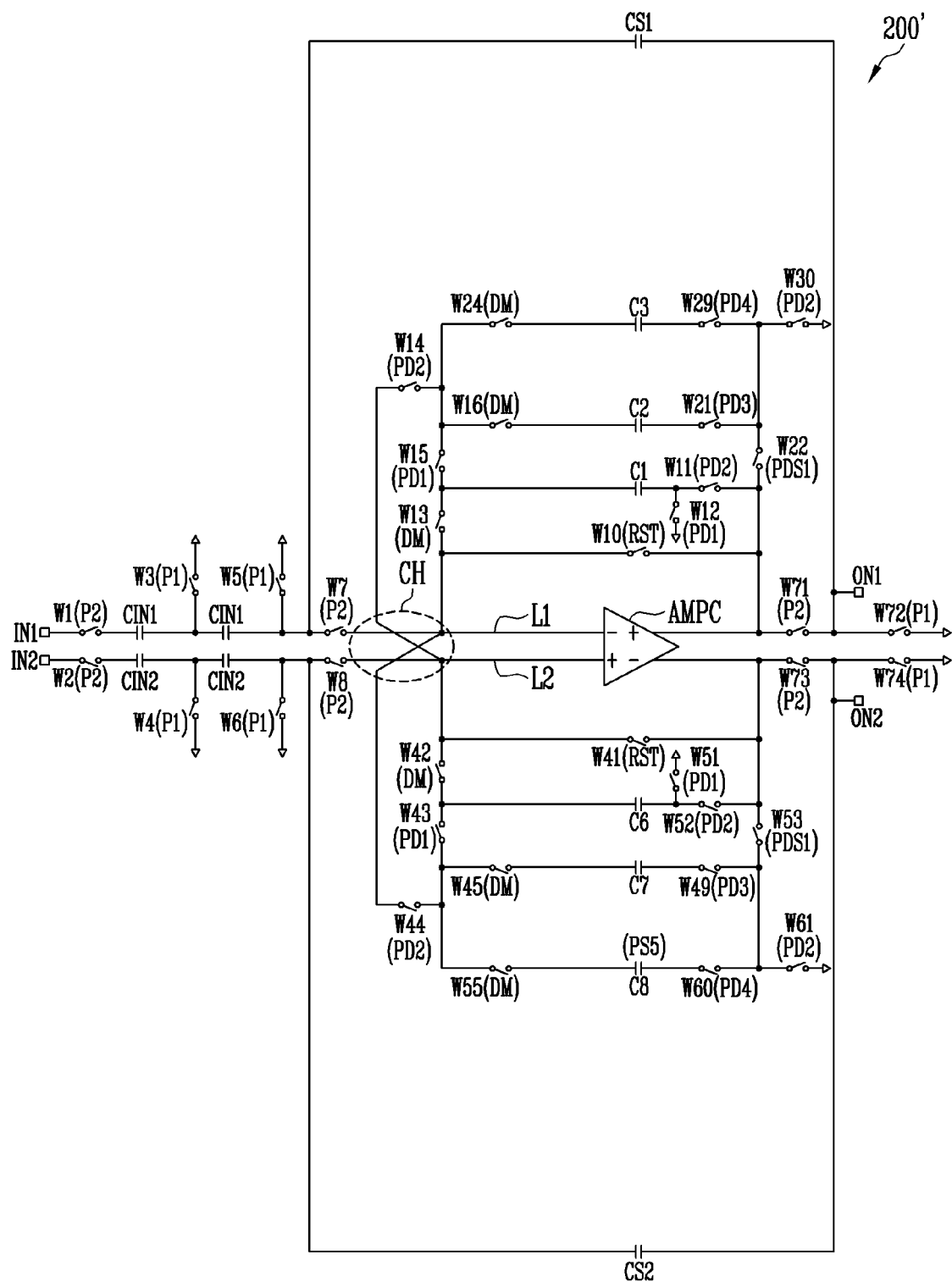
FIG. 8 is a circuit diagram illustrating components forming a band pass filter operating in a fully differential mode in a band pass filter circuit of FIG. 7.
Figure 9:
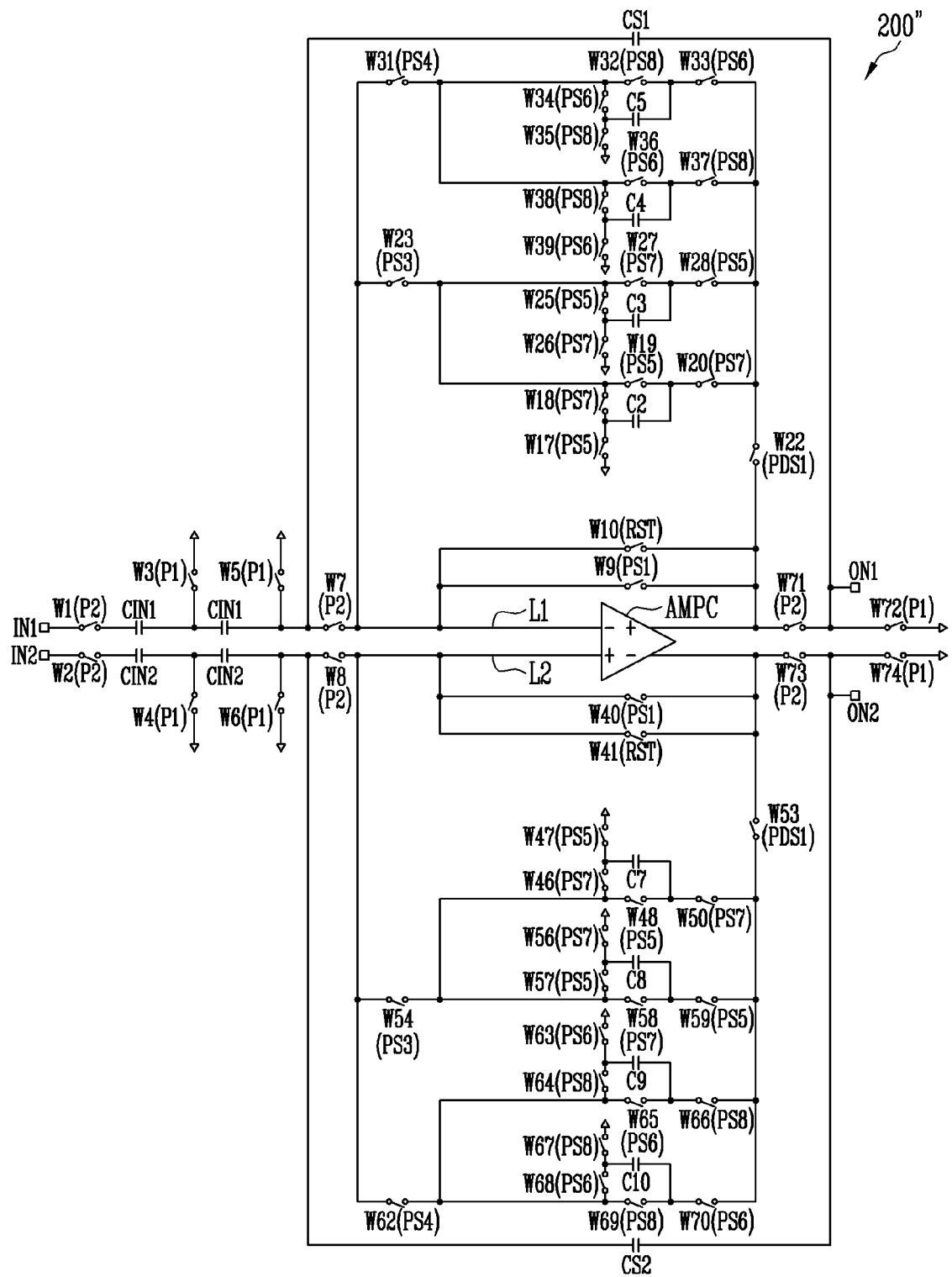
FIG. 9 is a circuit diagram illustrating components forming a band pass filter operating in a single-ended mode in the band pass filter circuit of FIG. 7.

FIG. 7 is a circuit diagram illustrating an embodiment of the band pass filter of FIG. 5. FIG. 8 is a circuit diagram illustrating components forming a band pass filter operating in a fully differential mode in a band pass filter circuit of FIG. 7. FIG. 9 is a circuit diagram illustrating components forming a band pass filter operating in a single-ended mode in the band pass filter circuit of FIG. 7. The band pass filter of FIG. 7 may be understood as a switched capacitor integrator circuit for sampling analog input signals.

Referring to FIG. 7, a band pass filter 200 may include an amplifier circuit AMPC, input capacitors CIN1 and CIN2, first and second gain capacitors CS1 and CS2, first to tenth capacitors C1 to C10, and first to seventy-fourth switches W1 to W74, respectively.

The amplifier circuit AMPC may be composed of a fully differential amplifier having two output terminals. The amplifier circuit AMPC may have an inverting input terminal connected to a first line L1 and a non-inverting input terminal connected to a second line L2.

Two first input capacitors CIN1 connected in series may be connected between a first input node IN1 and the first line L1. Two second input capacitors CIN2 connected in series may be connected between a second input node IN2 and the second line L2. The first input node IN1 may receive the first input signal IS1 of FIG. 5. The second input node IN2 may receive the second input signal IS2 of FIG. 5.

In some embodiments, each of the first input capacitors CIN1 may have the same capacitance as each of the second input capacitors CIN2.

The first switch W1 may be connected between the first input node IN1 and the first input capacitors CIN1, and the second switch W2 may be connected between the second input node IN2 and the second input capacitors CIN2. In FIG. 7, a control signal for turning on and off each switch is indicated in parenthesis adjacent to the reference symbol of the corresponding switch.

The third switch W3 may be connected between a node between the first input capacitors CIN1 and a reference voltage (or ground voltage), and the fourth switch W4 may be connected between a node between the second input capacitors CIN2 and the reference voltage. The fifth switch W5 may be connected between one end of the seventh switch W7 and the reference voltage, and the sixth switch W6 may be connected between one end of the eighth switch W8 and the reference voltage.

The first input capacitors CIN1 may function as the first low frequency attenuation unit LFA1 of FIGS. 5 and 6. When the first switch W1 is turned on, the first input capacitors CIN1 may perform low frequency attenuation on a signal received through the first input node IN1. When the third and fifth switches W3 and W5 are turned on, the first input capacitors CIN1 may be "initialized" (residual charge may be discharged to ground).

The second input capacitors CIN2 may function as the second low frequency attenuation unit LFA2 of FIGS. 5 and 6. When the second switch W2 is turned on, the second input capacitors CIN2 may perform low frequency attenuation on a signal received through the second input node IN2. When the fourth and sixth switches W4 and W6 are turned on, the second input capacitors CIN2 may be initialized.

The seventh switch W7 may have one end connected to the first input capacitors CIN1 and the other end connected to the first line L1. The eighth switch W8 may have one end connected to the second input capacitors CIN2 and the other end connected to the second line L2. In the circuit structure of FIG. 7, a channel CH may be formed between the input capacitors CIN1 and CIN2 and the first and second lines L1 and L2. The circuit structure of the first gain capacitor CS1, the first to fifth capacitors C1 to C5, and the ninth to thirty-ninth switches W9 to W39, e.g., upper components of the amplifier circuit AMPC (as illustrated in FIG. 7) may be connected to the first and second lines L1 and L2 through the channel CH. The circuit structure of the second gain capacitor CS2, the sixth to tenth capacitors C6 to C10, and the fortieth to seventieth switches W40 to W70, e.g., lower components of the amplifier circuit AMPC, may be connected to the first and second lines L1 and L2 through the channel CH.

The first gain capacitor CS1 may be connected between one end of the seventh switch W7 and the first output node ON1. The second gain capacitor CS2 may be connected between one end of the eighth switch W8 and the second output node ON2.

The ninth switch W9 may be connected between the inverting input terminal of the amplifier circuit AMPC and the non-inverting output terminal of the amplifier circuit AMPC. The tenth switch W10 may be connected in parallel with the ninth switch W9 between the inverting input terminal of the amplifier circuit AMPC and the non-inverting output terminal of the amplifier circuit AMPC.

The first capacitor C1 may be connected between the inverting input terminal of the amplifier circuit AMPC and the non-inverting output terminal of the amplifier circuit AMPC. The thirteenth switch W13 may be connected between one end of the first capacitor C1 and the inverting input terminal of the amplifier circuit AMPC. The eleventh switch W11 may be connected between the other end of the first capacitor C1 and the non-inverting output terminal of the amplifier circuit AMPC. The twelfth switch W12 may be connected between the other end of the first capacitor C1 and the reference voltage.

The second capacitor C2 may be switchedly connected (through switches W16 and W21) between the inverting input terminal of the amplifier circuit AMPC and the non-inverting output terminal of the amplifier circuit AMPC. The fifteenth switch W15 may be connected between one end of the second capacitor C2 and the thirteenth switch W13. The sixteenth switch W16 may be connected between the fifteenth switch W15 and one end of the second capacitor C2. The seventeenth switch W17 may be connected between one end of the second capacitor C2 and the reference voltage. The twenty-first switch W21 may be connected between the other end of the second capacitor C2 and the non-inverting output terminal of the amplifier circuit AMPC. The twenty-second switch W22 may be connected between the twenty-first switch 21 and the non-inverting output terminal of the amplifier circuit AMPC.

The fourteenth switch W14 may be connected between a node between the fifteenth and sixteenth switches W15 and W16 and the non-inverting input terminal of the amplifier circuit AMPC. The eighteenth switch W18 may be connected between the fourteenth switch W14 and one end of the second capacitor C2. The nineteenth switch W19 may be connected between the fourteenth switch W14 and the other end of the second capacitor C2. The twentieth switch W20 may be connected between the other end of the second capacitor C2 and the twenty-second switch W22.

The third capacitor C3 may be connected between the inverting input terminal of the amplifier circuit AMPC and the non-inverting output terminal of the amplifier circuit AMPC. The twenty-fourth switch W24 may be connected between one end of the third capacitor C3 and the twenty-third switch W23. The twenty-sixth switch W26 may be connected between one end of the third capacitor C3 and the reference voltage. The twenty-ninth switch W29 may be connected between the other end of the third capacitor C3 and the reference voltage. The thirtieth switch W30 may be connected between the twenty-ninth switch W29 and the reference voltage.

The twenty-fifth switch W25 may be connected between one end of the third capacitor C3 and the twenty-third switch W23. The twenty-seventh switch W27 may be connected between the twenty-third switch W23 and the other end of the third capacitor C3. The twenty-eighth switch W28 may be connected between the other end of the third capacitor C3 and the thirtieth switch W30.

The twenty-third switch W23 may be connected between the twenty-fourth switch W24 and the other end of the seventh switch W7.

The fourth capacitor C4 may be connected between the inverting input terminal of the amplifier circuit AMPC and the non-inverting output terminal of the amplifier circuit AMPC. The thirty-ninth switch W39 may be connected between one end of the fourth capacitor C4 and the reference voltage. The thirty-eighth switch W38 may be connected between one end of the fourth capacitor C4 and the thirty-first switch W31. The thirty-sixth switch W36 may be connected between the thirty-first switch W31 and the other end of the fourth capacitor C4. The thirty-seventh switch W37 may be connected between the other end of the fourth capacitor C4 and the thirtieth switch W30.

The fifth capacitor C5 may be connected between the inverting input terminal of the amplifier circuit AMPC and the non-inverting output terminal of the amplifier circuit AMPC. The thirty-fifth switch W35 may be connected between one end of the fifth capacitor C5 and the reference voltage. The thirty-fourth switch W34 may be connected between one end of the fifth capacitor C5 and the thirty-first switch W31. The thirty-second switch W32 may be connected between the thirty-first switch W31 and the other end of the fifth capacitor C5. The thirty-third switch W33 may be connected between the other end of the fifth capacitor C5 and the thirtieth switch W30.

The thirty-first switch W31 may be connected between the other end of the seventh switch W7 and the thirty-second switch W32.

The circuit structure of the second gain capacitor CS2, the sixth to tenth capacitors C6 to C10, and the fortieth to seventieth switches W40 to W70 may be formed symmetrically with the circuit structure of the first gain capacitor CS1, the first to fifth capacitors C1 to C5, and the ninth to thirty-ninth switches W9 to W39 based on the amplifier circuit AMPC.

The fortieth switch W40 may be connected between the non-inverting input terminal of the amplifier circuit AMPC and the inverting output terminal of the amplifier circuit AMPC. The forty-first switch W41 may be connected between the non-inverting input terminal of the amplifier circuit AMPC and the inverting output terminal of the amplifier circuit AMPC.

The sixth capacitor C6 may be connected between the non-inverting input terminal of the amplifier circuit AMPC and the inverting output terminal of the amplifier circuit AMPC. The sixth capacitor C6 may have the same capacitance as the first capacitor C1. The forty-second switch W42 may be connected between one end of the sixth capacitor C6 and the non-inverting input terminal of the amplifier circuit AMPC. The forty-third switch W43 may be connected between one end of the sixth capacitor C6 and the forty-fifth switch W45. The forty-fourth switch W44 may be connected between the inverting input terminal of the amplifier circuit AMPC and the forty-third switch W43.

The fifty-first switch W51 may be connected between the other end of the sixth capacitor C6 and the reference voltage. The fifty-second switch W52 may be connected between the other end of the sixth capacitor C6 and the fifty-third switch W53. The fifty-third switch W53 may be connected between the fifty-second switch W52 and the other end of the seventh capacitor C7.

The seventh capacitor C7 may be connected between the non-inverting input terminal of the amplifier circuit AMPC and the inverting output terminal of the amplifier circuit AMPC. The seventh capacitor C7 may have the same capacitance as the second capacitor C2. The forty-fifth switch W45 may be connected between the forty-third switch W43 and one end of the seventh capacitor C7. The forty-sixth switch W46 may be connected between one end of the seventh capacitor C7 and the forty-fourth switch W44. The forty-seventh switch W47 may be connected between one end of the seventh capacitor C7 and the reference voltage. The forty-eighth switch W48 may be connected between the forty-sixth switch W46 and the other end of the seventh capacitor C7. The forty-ninth switch W49 may be connected between the other end of the seventh capacitor C7 and the fifty-third switch W53. The fiftieth switch W50 may be connected between the other end of the seventh capacitor C7 and the fifty-third switch W53.

The eighth capacitor C8 may be connected between the non-inverting input terminal of the amplifier circuit AMPC and the inverting output terminal of the amplifier circuit AMPC. The eighth capacitor C8 may have the same capacitance as the third capacitor C3. The fifty-fourth switch W54 may be connected between the other end of the eighth switch W8 and one end of the eighth capacitor C8. The fifty-fifth switch W55 may be connected between the fifty-fourth switch W54 and one end of the eighth capacitor C8. The fifty-seventh switch W57 may be connected between the fifty-fourth switch W54 and one end of the eighth capacitor C8. The fifty-sixth switch W56 may be connected between one end of the eighth capacitor C8 and the reference voltage.

The fifty-eighth switch W58 may be connected between the fifty-fourth switch W54 and the other end of the eighth capacitor C8. The fifty-ninth switch W59 may be connected between the other end of the eighth capacitor C8 and the sixty-first switch W61. The sixtieth switch W60 may be connected between the other end of the eighth capacitor C8 and the sixty-first switch W61. The sixty-first switch W61 may be connected between the sixtieth switch W60 and the reference voltage.

The ninth capacitor C9 may be connected between the non-inverting input terminal of the amplifier circuit AMPC and the inverting output terminal of the amplifier circuit AMPC. The ninth capacitor C9 may have the same capacitance as the fourth capacitor C4. The sixty-third switch W63 may be connected between one end of the ninth capacitor C9 and the reference voltage. The sixty-fourth switch W64 may be connected between one end of the ninth capacitor C9 and the sixty-second switch W62. The sixty-fifth switch W65 may be connected between the sixty-second switch W62 and the other end of the ninth capacitor C9. The sixty-sixth switch W66 may be connected between the other end of the ninth capacitor C9 and the sixty-first switch W61.

The sixty-second switch W62 may be connected between the other end of the eighth switch W8 and the sixty-fifth switch W65.

The tenth capacitor C10 may be connected between the non-inverting input terminal of the amplifier circuit AMPC and the inverting output terminal of the amplifier circuit AMPC. The tenth capacitor C10 may have the same capacitance as the fifth capacitor C5. The sixty-seventh switch W67 may be connected between one end of the tenth capacitor C10 and the reference voltage. The sixty-eighth switch W68 may be connected between one end of the tenth capacitor C10 and the sixty-second switch W62. The sixty-ninth switch W69 may be connected between the sixty-second switch W62 and the other end of the tenth capacitor C10. The seventieth switch W70 may be connected between the other end of the tenth capacitor C10 and the sixty-first switch W61.

The seventy-first switch W71 may be connected between the non-inverting output terminal of the amplifier circuit AMPC and the first output node ON1. The seventy-third switch W73 may be connected between the inverted output terminal of the amplifier circuit AMPC and the second output node ON2. The seventy-second switch W72 may be connected between the first output node ON1 and the reference voltage. The seventy-fourth switch W74 may be connected between the second output node ON2 and the reference voltage.

The first to fifth capacitors C1 to C5 and the first gain capacitor CS1 may be some examples of the first capacitors CP1 in the capacitor circuit 210 of FIG. 5. The sixth to tenth capacitors C6 to C10 and the second gain capacitor CS2 may be some examples of second capacitors CP2 in the second capacitor circuit 220 of FIG. 5.

Referring to FIG. 8, a band pass filter 200' operating in the fully differential mode may be formed by: the first input capacitors CIN1, the second input capacitors CIN2, the first to eighth switches W1 to W8, the first to third capacitors C1 to C3, the first gain capacitor CS1, the tenth to sixteenth, twenty-first, twenty-second, twenty-fourth, twenty-ninth, and thirtieth switches W10 to W16, W21, W22, W24, W29, and W30, the sixth to eighth capacitors C6 to C8, the second gain capacitor CS2, the forty-first to forty-fifth, forty-ninth, fifty-first to fifty-third, fifty-fifth, sixtieth, and sixty-first switches W41 to W45, W49, W51 to W53, W55, W60, and W61, and the seventy-first to seventy-fourth switches W71 to W74. The band pass filter 200' may operate as the band pass filter BPF1 of FIG. 6A. In FIG. 8, the first and second input capacitors CIN1 and CIN2; the first to third capacitors C1-C3; the sixth to eight capacitors C6-C8; and the first and second gain capacitors CS1 and CS2 may be together considered a first group of capacitors, where the first group of capacitors is connected between (i) the first and second input terminals IN1 and IN2; and (ii) the first and second output terminals ON1 and ON2. (The first group of capacitors is connected between (i) and (ii) denoted above.)

In some embodiments, the sixth to eighth capacitors C6 to C8, the second gain capacitor CS2, the forty-first to forty-fifth, forty-ninth, fifty-first to fifty-third, fifty-fifth, sixtieth, and sixty-first switches W41 to W45, W49, W51 to W53, W55, W60, and W61 may have a symmetrical circuit structure with the first to third capacitors C1 to C3, the first gain capacitor CS1, the tenth to sixteenth, twenty-first, twenty-second, twenty-fourth, twenty-ninth, and thirtieth switches W10 to W16, W21, W22, W24, W29, and W30 based on the amplifier circuit AMPC.

Referring to FIG. 9, a second band pass filter 200" may operate in the single-ended mode and may operate as the band pass filter BPF2 of FIG. 6B. The second band pass filter 200" may be formed by: the first input capacitors CIN1, the second input capacitors CIN2, the first to eighth switches W1 to W8, the second to fifth capacitors C2 to C5, the ninth, tenth, seventeenth to twentieth, twenty-second, twenty-third, twenty-fifth to twenty-eighth, and thirty-first to thirty-ninth switches W9, W10, W17 to W20, W22, W23, W25 to W28, and W31 to W39, the seventh to tenth capacitors C7 to C10, the fortieth, forty-first, forty-sixth to forty-eighth, fiftieth, fifty-third, fifty-fourth, fifty-sixth to fifty-ninth, and sixty-second to seventieth switches W40, W41, W46 to W48, W50, W53, W54, W56 to W59, and W62 to W70, and the seventy-first to seventy-fourth switches W71 to W74. In FIG. 9, the first input capacitors CIN1; the first to fifth capacitors C1-C5; and the first gain capacitor CS1 may be together considered a second group of capacitors. Moreover, the second input capacitors CIN2; the seventh to twelfth capacitors C7-C12; and the second gain capacitor CS1 may be together considered a third group of capacitors.

In the example of FIG. 9, the seventh to tenth capacitors C7 to C10, the fortieth, forty-first, forty-sixth to forty-eighth, fiftieth, fifty-third, fifty-fourth, fifty-sixth to fifty-ninth, and sixty-second to seventieth switches W40, W41, W46 to W48, W50, W53, W54, W56 to W59, and W62 to W70 may have a symmetrical circuit structure with the second to fifth capacitors C2 to C5, the ninth, tenth, seventeenth to twentieth, twenty-second, twenty-third, twenty-fifth to twenty-eighth, and thirty-first to thirty-ninth switches W9, W10, W17 to W20, W22, W23, W25 to W28, and W31 to W39 based on the amplifier circuit AMPC.

In FIG. 8, the band pass filter 200' may include the second, third, seventh, and eighth capacitors C2, C3, C7, and C8. In FIG. 9, the band pass filter 200" may include the second, third, seventh, and eighth capacitors C2, C3, C7, and C8. As such, the fully differential mode band pass filter 200' and the single-ended mode band pass filter 200" may share the second, third, seventh, and eighth capacitors C2, C3, C7, and C8.

Figure 10:
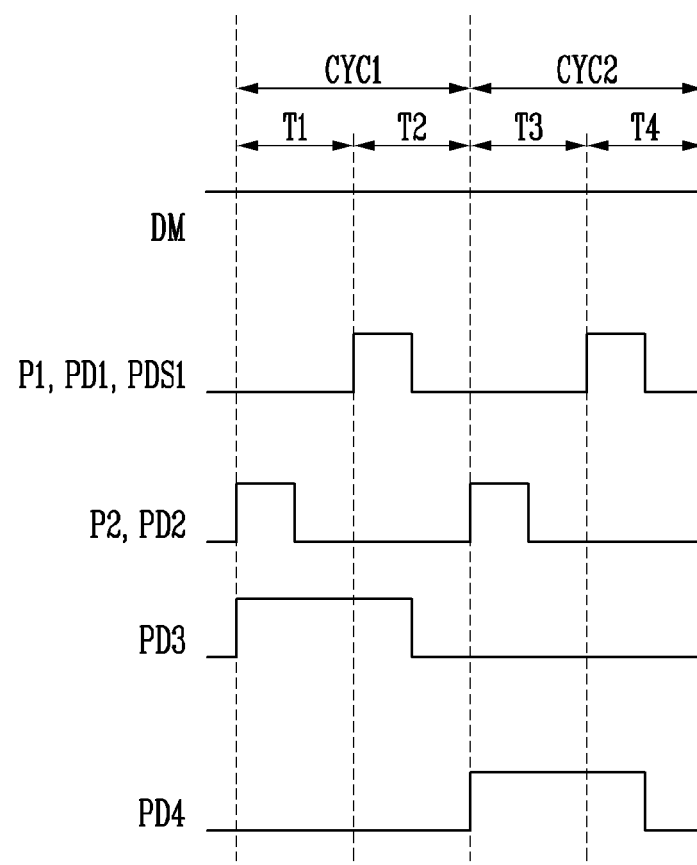
FIG. 10 is a timing diagram illustrating signals controlling the band pass filter of FIG. 8.
Figure 11:
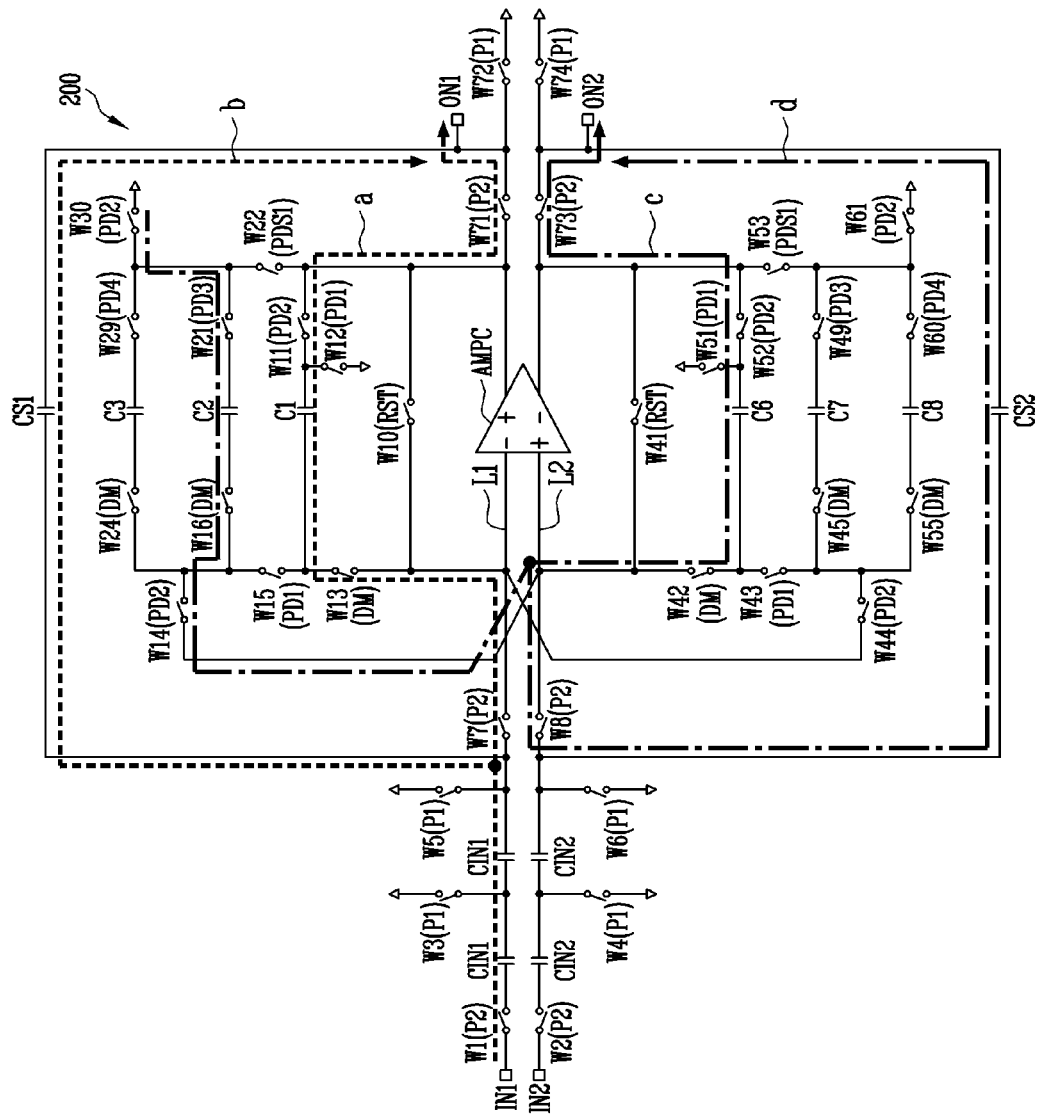
FIGS. 11 and 12 are circuit diagrams for explaining current paths formed in the band pass filter of FIG. 8 in a first cycle of FIG. 10.
Figure 12:
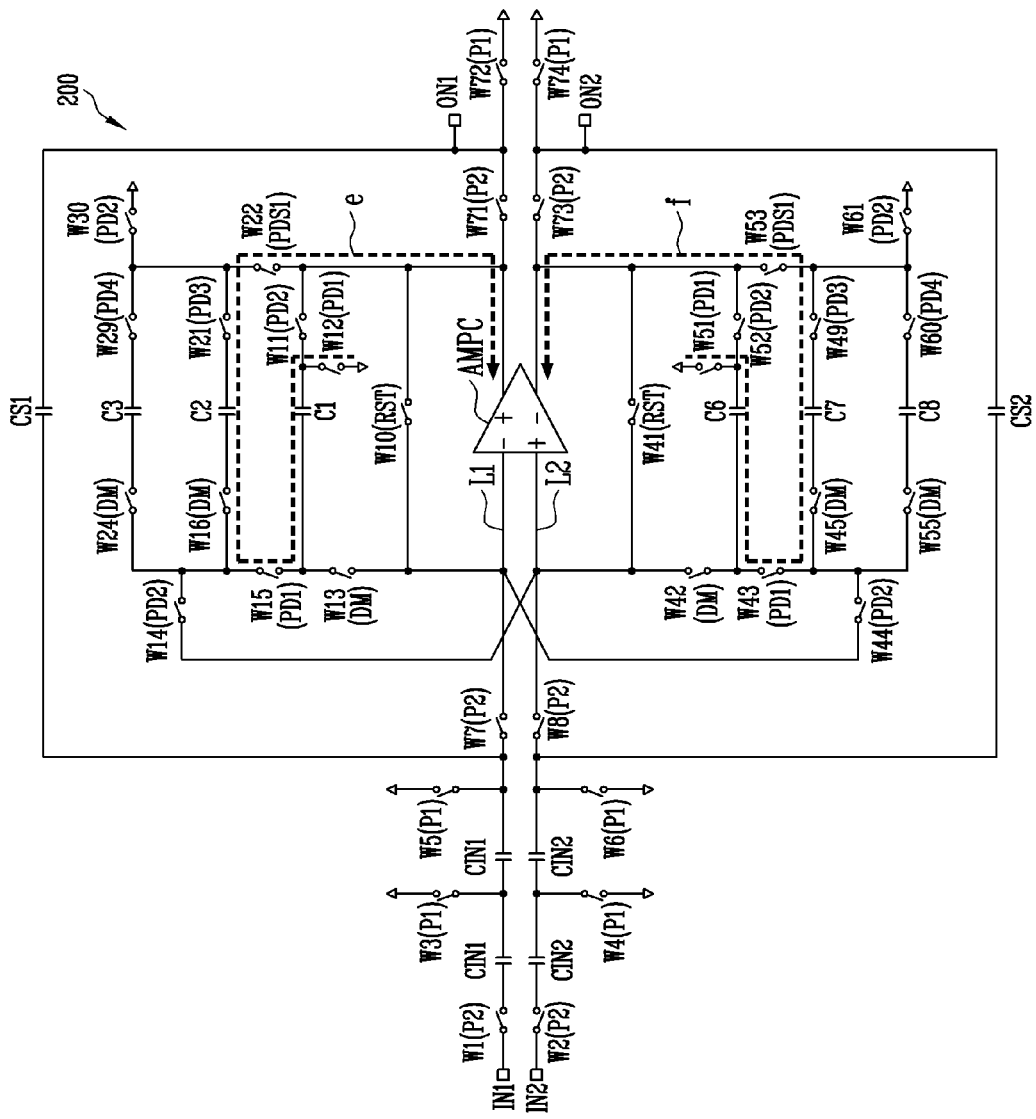

FIG. 10 is a timing diagram illustrating signals controlling the band pass filter of FIG. 8. FIGS. 11 and 12 are circuit diagrams for explaining current paths formed in the band pass filter of FIG. 8 in a first cycle of FIG. 10.

Figure 13:
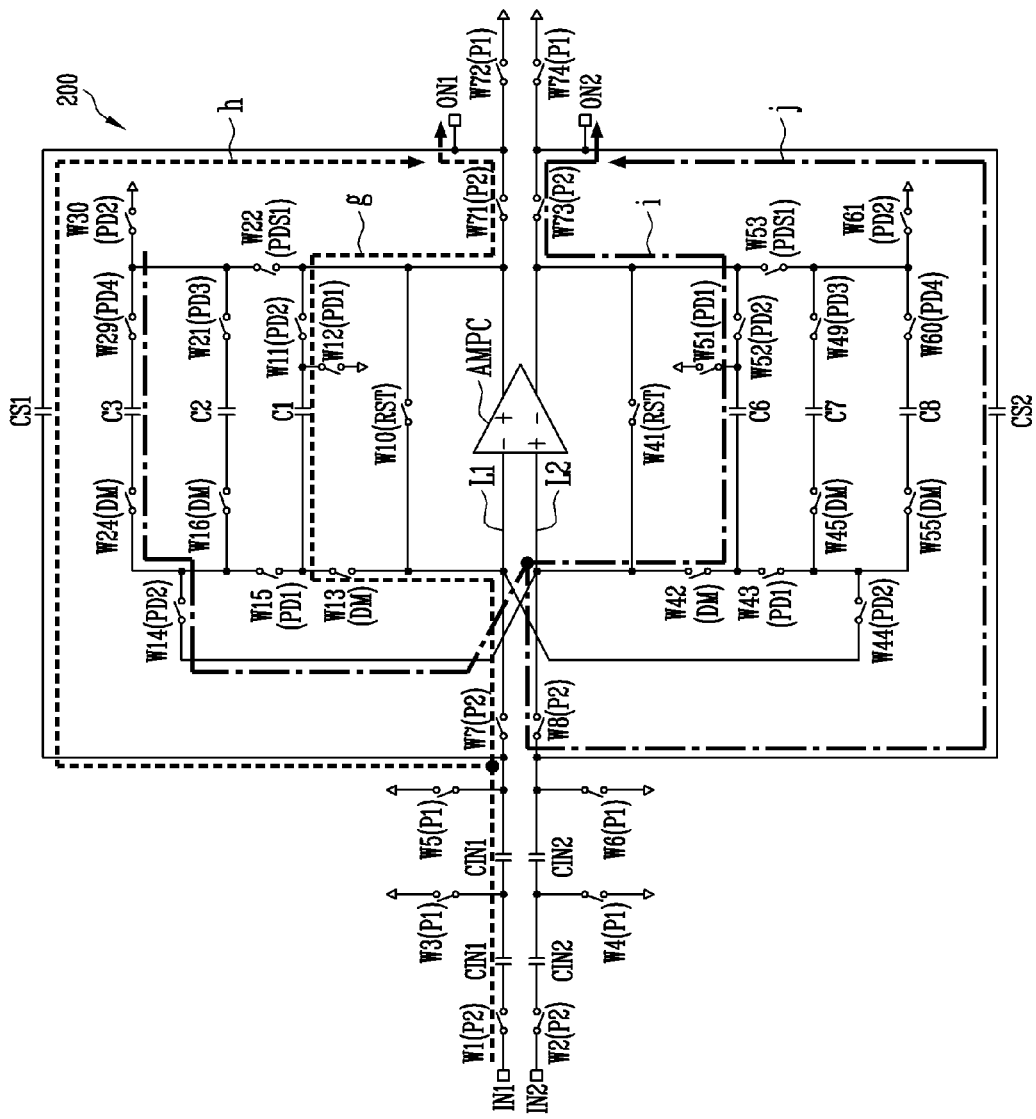
FIGS. 13 and 14 are circuit diagrams for explaining current paths formed in the band pass filter of FIG. 8 in a second cycle of FIG. 10.
Figure 14:
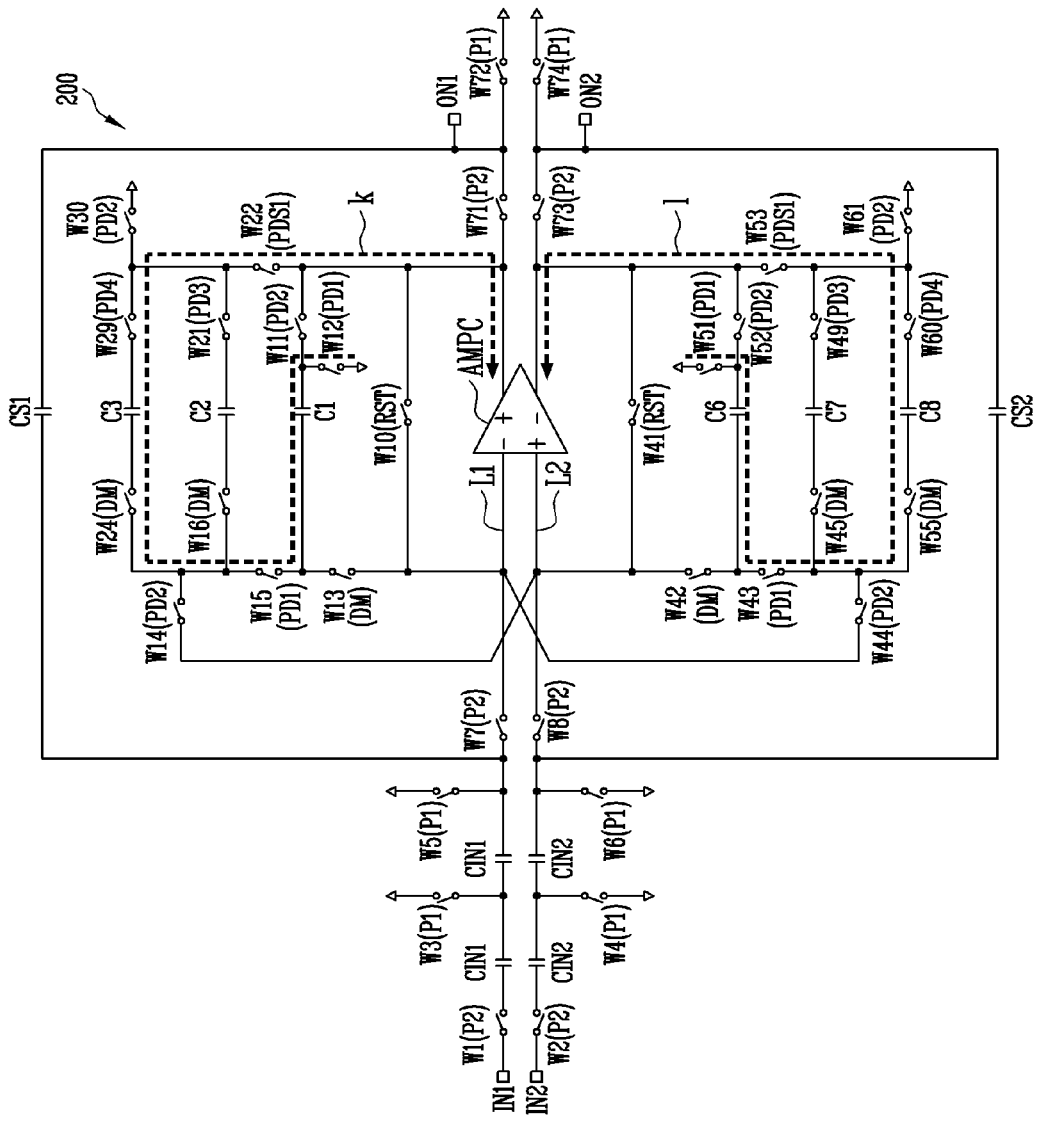

FIGS. 13 and 14 are circuit diagrams for explaining current paths formed in the band pass filter of FIG. 8 in a second cycle of FIG. 10.

Referring to FIG. 10, first and second cycles CYC1 and CYC2 may be provided. By repeating the first and second cycles CYC1 and CYC2, the band pass filter of FIG. 8 may operate in the fully differential mode. The required time of each of the first and second periods CYC1 and CYC2 may be 1/fs. As such, a switching frequency may be fs.

The control signals DM, P1, P2, PD1 to PD4, and PDS1 of FIG. 10 may be provided from a controller included in the sensor driver 120 of FIG. 1. For example, the control signals DM, P1, P2, PD1 to PD4, and PDS1 of FIG. 10 may be provided by the signal processor DSP functioning in part as the controller.

The first cycle CYC1 may include a first time period T1 and a second time period T2. In the first time period T1, a mode control signal DM and the control signals P2, PD2 and PD3 may have a high level. Switches receiving the high-level mode control signal DM and control signals P2, PD2, and PD3 may be turned on.

Accordingly, referring to FIG. 11, a current path (a) flowing from the first input node IN1 to the first output node ON1 through the first input capacitors CIN1 and the first capacitor C1 may be formed. A current path (b) flowing from the first input node IN1 to the first output node ON1 through the first input capacitors CIN1 and the first gain capacitor CS1 may be formed. Accordingly, each of the first capacitor C1 and the first gain capacitor CS1 may perform integration (or sampling) on a first input signal received through the first input capacitors CIN1.

Although a current path through the second input capacitors CIN2 is not shown in FIG. 11 for clarity of illustration, each of the sixth capacitor C6 and the second gain capacitor CS2 may also perform integration on a second input signal received through the second input capacitors CIN2. To this end, a current path flowing from the second input node IN2 to the second output node ON2 through the second input capacitors CIN2 and the sixth capacitor C6 may be formed. A current path flowing from the second input node IN2 to the second output node ON2 through the second input capacitors CIN2 and the second gain capacitor CS2 may be formed.

A current path (c) flowing from the second capacitor C2 to the second output node ON2 through the sixth capacitor C6 may be formed. (Note that because the second output node ON2 may be at a negative voltage, the current flow in path (c) is shown from the reference voltage terminal, e.g., a ground voltage terminal, to the second output node ON2.) Also, a current path (d) flowing from the second capacitor C2 to the second output node ON2 through the second gain capacitor CS2 may be formed. Accordingly, each of the sixth capacitor C6 and the second gain capacitor CS2 may integrate charges of the second capacitor C2 together with the second input signal. Accordingly, the second sampling signal may be output through the second output node ON2. As such, the second capacitor C2, the sixth capacitor C6, the second gain capacitor CS2, and the amplifier circuit AMPC may function as a sign inverted z to −z transformed SC integrator. For example, the second capacitor C2, the sixth capacitor C6, the second gain capacitor CS2, and the amplifier circuit AMPC may function as a high pass filter for the second input signal by using the first input signal as a differential signal.

Although not shown in FIG. 11 for clarity of illustration, a current path flowing from the seventh capacitor C7 to the first output node ON1 through the first capacitor C1 may also be formed. Also, a current path flowing from the seventh capacitor C7 to the first output node ON1 through the first gain capacitor CS1 may be formed. Accordingly, each of the first capacitor C1 and the first gain capacitor CS1 may integrate charges of the seventh capacitor C7 together with the first input signal. Accordingly, the first sampling signal may be output through the first output node ON1. As such, the first capacitor C1, the first gain capacitor CS1, the seventh capacitor C7, and the amplifier circuit AMPC may function as a sign inverted z to −z transformed SC integrator. For example, the first capacitor C1, the first gain capacitor CS1, the seventh capacitor C7, and the amplifier circuit AMPC may function as a high pass filter for the first input signal by using the second input signal as a differential signal.

Returning to FIG. 10, in the second time period T2, the mode control signal DM and the control signals P1, PD1, PDS1, and PD3 may have the high level. Switches receiving the high-level mode control signal DM and control signals P1, PD1, PDS1, and PD3 may be turned on.

Accordingly, referring to FIG. 12, a current path (e) flowing from the first capacitor C1 to the non-inverting output terminal of the amplifier circuit AMPC through the second capacitor C2 may be formed. Accordingly, charges of the first capacitor C1 may be stored in the second capacitor C2. Similarly, a current path (f) flowing from the sixth capacitor C6 to the inverting output terminal of the amplifier circuit AMPC through the seventh capacitor C7 may be formed. Accordingly, charges of the sixth capacitor C6 may be stored in the seventh capacitor C7. As such, in the second time period T2 of the first cycle CYC1 of FIG. 10, the charges of the first capacitor C1 according to the first input signal may be stored in the second capacitor C2, and the first input signal may be provided as a differential signal in a subsequent first time period T1. In addition, the charges of the sixth capacitor C6 according to the second input signal may be stored in the seventh capacitor C7, and the second input signal may be provided as a differential signal in the subsequent first time period T1.

Figure 15:
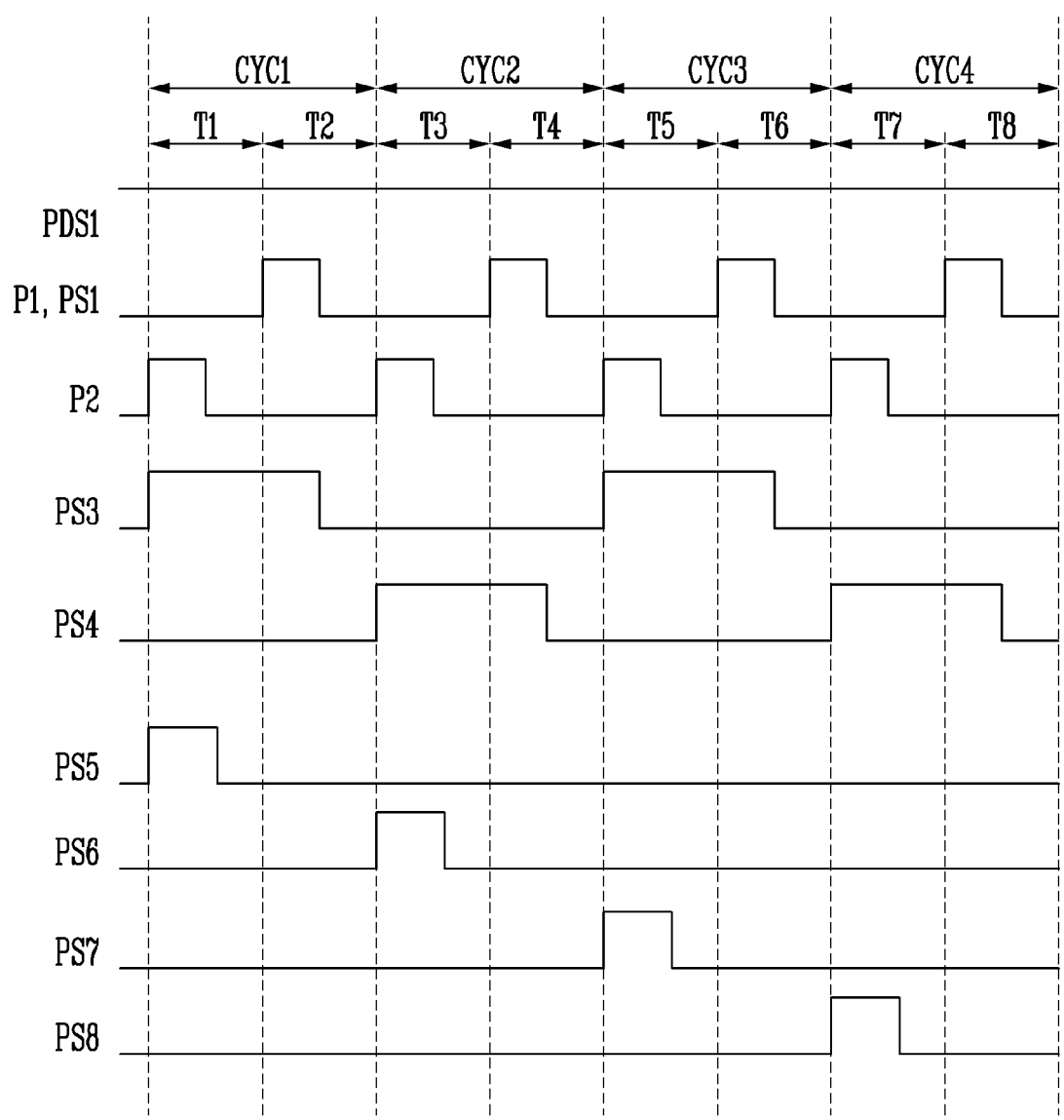
FIG. 15 is a timing diagram illustrating signals controlling the band pass filter of FIG. 9.

In some embodiments, a reset signal RST may be selectively enabled between and within each cycle. It is noted that in FIG. 7 and later figures, the reset signal RST is shown to control switches W10 and W40 whereas control signal PS1 is shown to control the parallel connected switches W9 and W10, such that the signal PS1 could serve as a reset signal if desired in other embodiments. Thus, in other embodiments, one of switches W9 and W10, and one of switches W40 and W41 may be omitted, and the reset control signal may be applied to the remaining ones of the switches. However, since control signals PS1 and P1 may have the same timing (and may effectively be the same signal) as illustrated in FIGS. 10 and 15, there may be a circuit complexity tradeoff between eliminating two of the above-noted switches and making provisions for providing the PS1 signal sometimes with a different timing than the PS1 signal (to initiate the reset operation).

Returning to FIG. 10, the second cycle CYC2 may include a third time period T3 and a fourth time period T4. In the third time period T3, the mode control signal DM and the control signals P2, PD2, and PD4 may have the high level. Switches receiving the high-level mode control signal DM and control signals P2, PD2, and PD4 may be turned on.

Referring to FIG. 13, a current path (g) flowing from the first input node IN1 to the first output node ON1 through the first input capacitors CIN1 and the first capacitor C1 may be formed. A current path (h) flowing from the first input node IN1 to the first output node ON1 through the first input capacitors CIN1 and the first gain capacitor CS1 may be formed.

Although not shown in FIG. 13 to avoid visual complexity, a current path flowing from the second input node IN2 to the second output node ON2 through the second input capacitors CIN2 and the sixth capacitor C6 may be formed. A current path flowing from the second input node IN2 to the second output node ON2 through the second input capacitors CIN2 and the second gain capacitor CS2 may be formed.

A current path (i) flowing from the third capacitor C3 to the second output node ON2 through the sixth capacitor C6 may be formed. Also, a current path (j) flowing from the third capacitor C3 to the second output node ON2 through the second gain capacitor CS2 may be formed. Accordingly, each of the sixth capacitor C6 and the second gain capacitor CS2 may integrate charges of the third capacitor C3 together with the second input signal. Accordingly, the second sampling signal may be output through the second output node ON2. As such, the third capacitor C3, the sixth capacitor C6, the second gain capacitor CS2, and the amplifier circuit AMPC may function as a sign inverted z to −z transformed SC integrator. For example, the third capacitor C3, the sixth capacitor C6, the second gain capacitor CS2, and the amplifier circuit AMPC may function as a high pass filter for the second input signal by using the first input signal as a differential signal.

Although not shown in FIG. 13 for clarity of illustration, a current path flowing from the eighth capacitor C8 to the first output node ON1 through the first capacitor C1 may be formed. Also, a current path flowing from the eighth capacitor C8 to the first output node ON1 through the first gain capacitor CS1 may be formed. Accordingly, each of the first capacitor C1 and the first gain capacitor CS1 may integrate charges of the eighth capacitor C8 together with the first input signal. Accordingly, the first sampling signal may be output through the first output node ON1. As such, the first capacitor C1, the first gain capacitor CS1, the eighth capacitor C8, and the amplifier circuit AMPC may function as a sign inverted z to −z transformed SC integrator. For example, the first capacitor C1, the first gain capacitor CS1, the eighth capacitor C8, and the amplifier circuit AMPC may function as a high pass filter for the first input signal by using the second input signal as a differential signal.

Returning to FIG. 10, in the fourth time period T4, the mode control signal DM and the control signals P1, PD1, PDS1, and PD4 may have the high level. Switches receiving the high-level mode control signal DM and control signals P1, PD1, PDS1, and PD4 may be turned on.

Accordingly, referring to FIG. 14, a current path (k) flowing from the first capacitor C1 to the non-inverting output terminal of the amplifier circuit AMPC through the third capacitor C3 may be formed. The charges of the first capacitor C1 may be stored in the third capacitor C3. Similarly, a current path (l) flowing from the sixth capacitor C6 to the inverting output terminal of the amplifier circuit AMPC through the eighth capacitor C8 may be formed. The charges of the sixth capacitor C6 may be stored in the eighth capacitor C8. As such, in the fourth time period T4 of the second cycle CYC2 of FIG. 10, the charges of the first capacitor C1 according to the first input signal may be stored in the third capacitor C3, and the first input signal may be provided as a differential signal in a subsequent third time period T3. In addition, the charges of the sixth capacitor C6 according to the second input signal may be stored in the eighth capacitor C8, and the second input signal may be provided as a differential signal in the subsequent third time period T3.

A fully differential mode band pass filter can be implemented by the high pass filters provided as described above. In this case, the center frequency of the band pass filter may be fs/4, and the gain value of the band pass filter may be CIN/4CS (here, CIN may be the capacitance of one input capacitor and CS may be the capacitance of one gain capacitor). The Q factor of the band pass filter may be adjusted according to the capacitances of the first to sixth capacitors C1 to C6 and the first and second gain capacitors CS1 and CS2.

Figure 16:
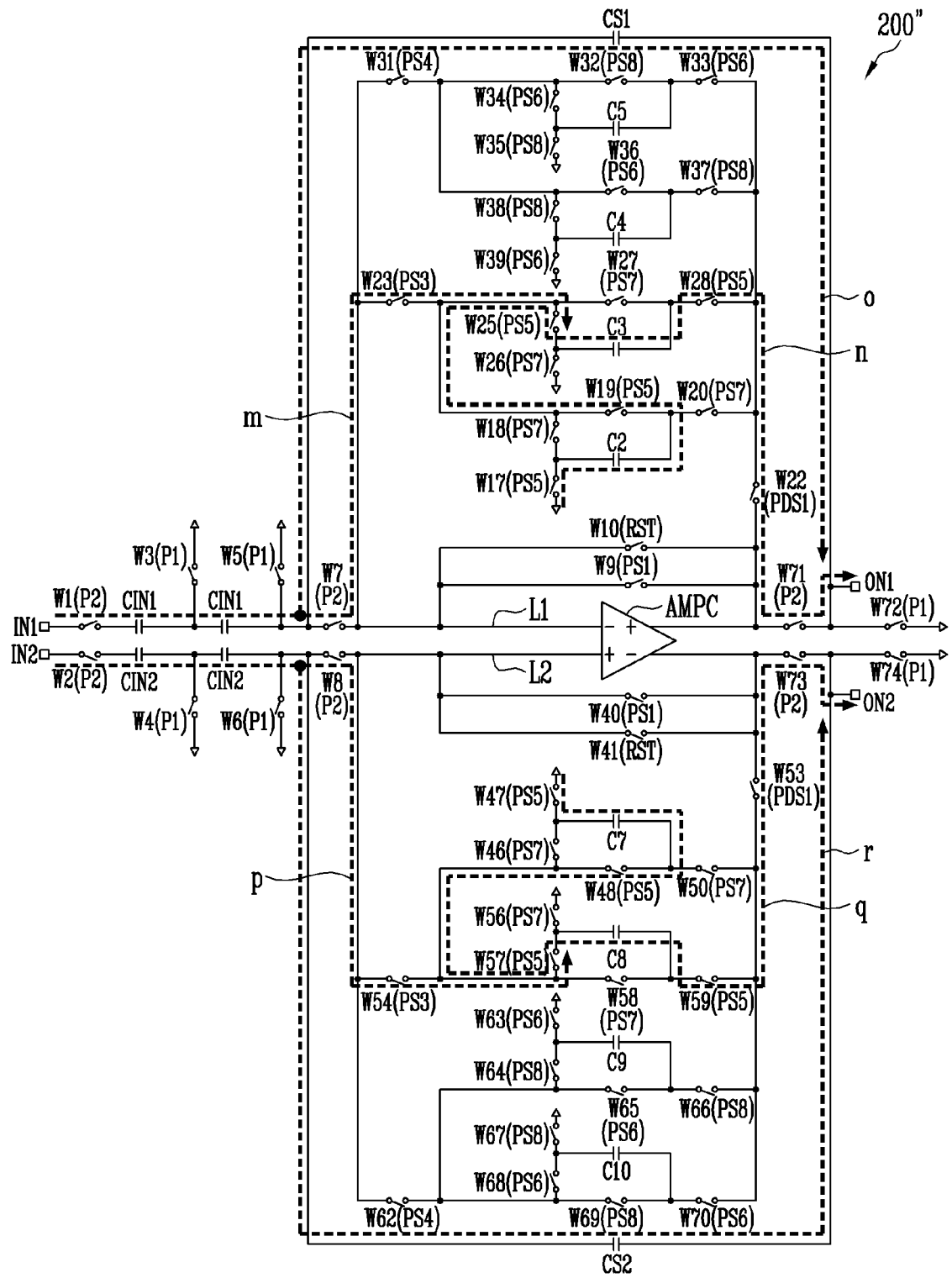
FIGS. 16 and 17 are circuit diagrams for explaining current paths formed in the band pass filter of FIG. 9 in first and fifth time periods of FIG. 15.
Figure 17:
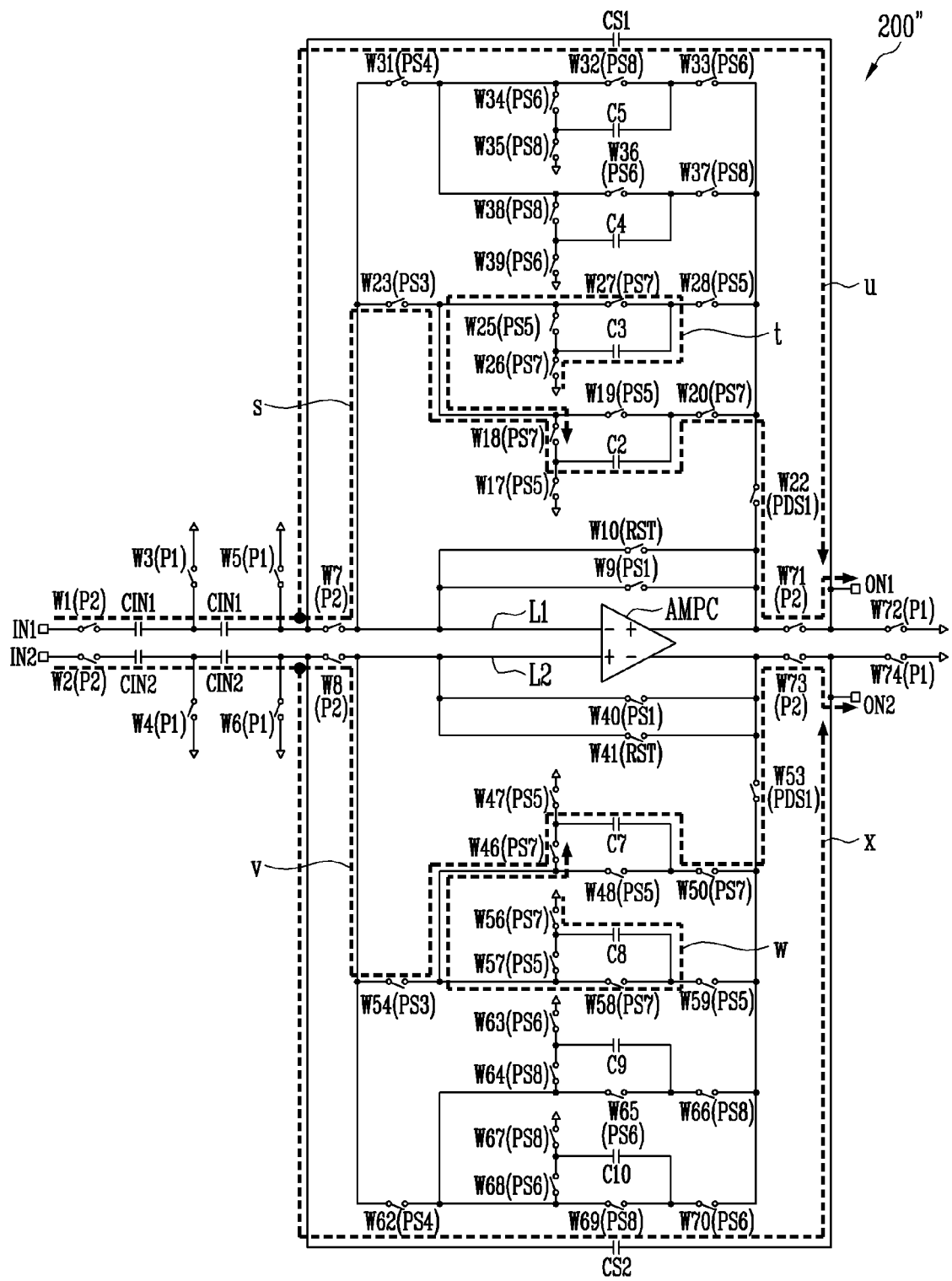
Figure 18:
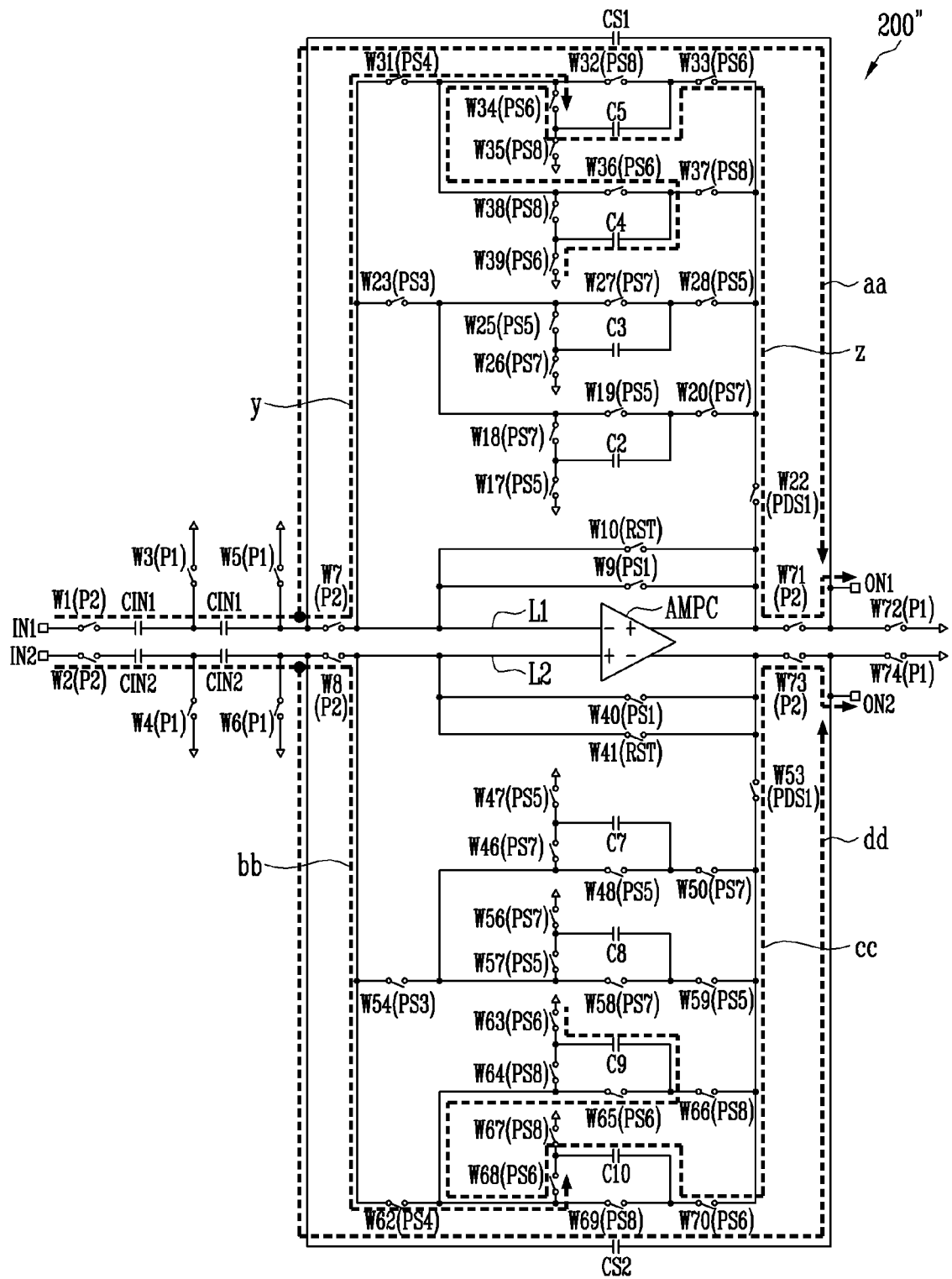
FIGS. 18 and 19 are circuit diagrams for explaining current paths formed in the band pass filter of FIG. 9 in third and seventh time periods of FIG. 15.
Figure 19:
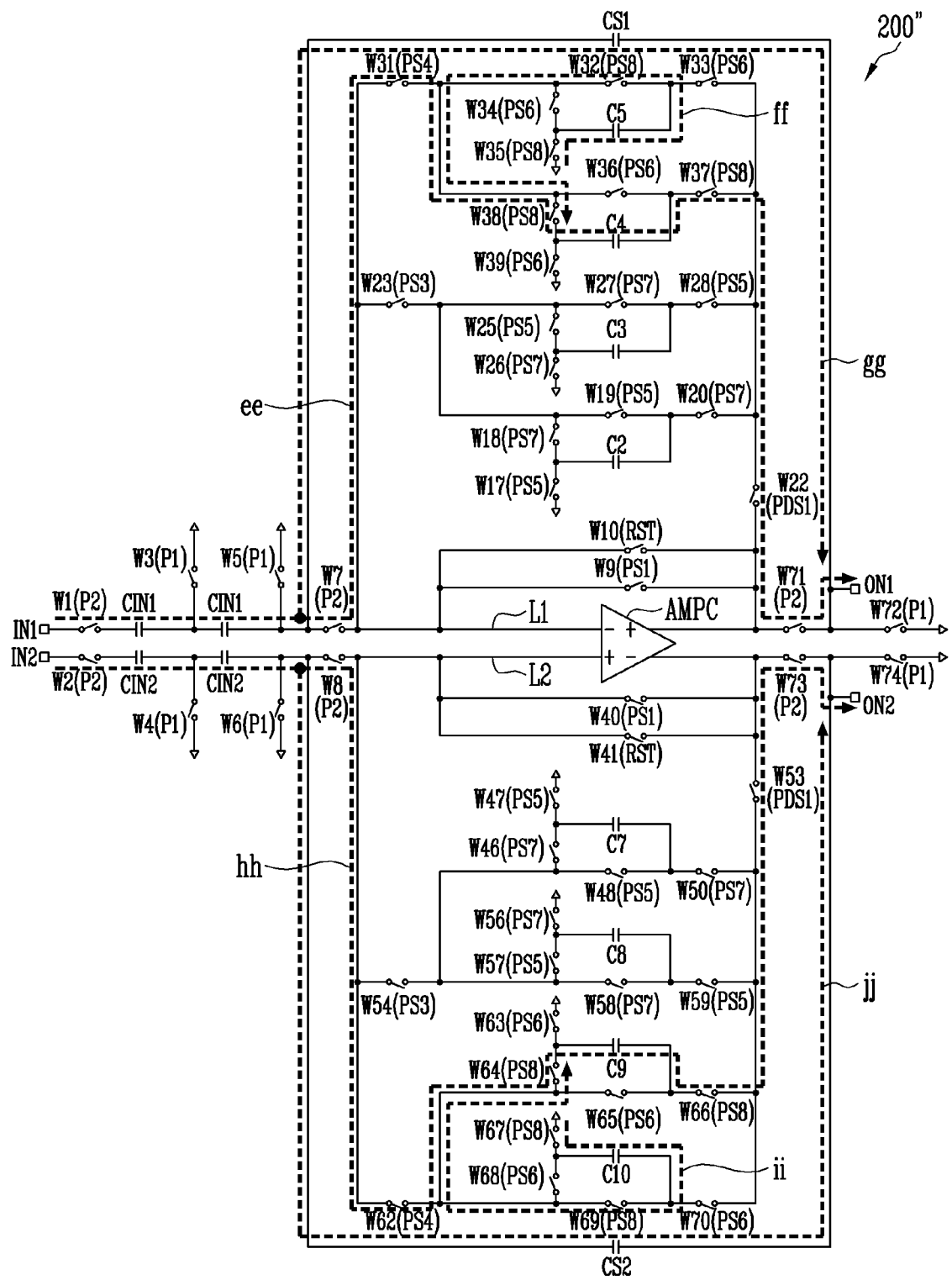

FIG. 15 is a timing diagram illustrating signals controlling the band pass filter of FIG. 9. FIGS. 16 and 17 are circuit diagrams for explaining current paths formed in the band pass filter of FIG. 9 in first and fifth time periods of FIG. 15. FIGS. 18 and 19 are circuit diagrams for explaining current paths formed in the band pass filter of FIG. 9 in third and seventh time periods of FIG. 15.

Referring to FIG. 15, first to fourth cycles CYC1 to CYC4 may be provided. By repeating the first to fourth cycle CYC1 to CYC4, the band pass filter of FIG. 9 may operate as a single-ended mode band pass filter circuit for each input signal. A set time of each of the first to fourth cycle CYC1 to CYC4 may be 1/fs (e.g., a short enough time to sample input signals for reconstructing the signals with desired high frequency components according to the Nyquist theorem). As such, a switching frequency may be fs.

The first cycle CYC1 may include a first time period T1 and a second time period T2. In the first time period T1, control signals PDS1, P2, PS3, and PS5 may have the high level. Switches receiving the high-level control signals PDS1, P2, PS3, and PS5 may be turned on.

The mode control signal DM may be disabled. Switching elements receiving the mode control signal DM may be turned off.

Referring to FIG. 16, a current path (m) flowing from the first input node IN1 to the third capacitor C3 through the first input capacitors CIN1 may be formed. A current path (n) flowing from the second capacitor C2 to the first output node ON1 through the third capacitor C3 may be formed. Accordingly, the third capacitor C3 may integrate charges of the second capacitor C2 together with the first input signal. In addition, a current path (o) may be formed, and the first gain capacitor CS1 may integrate the first input signal. Accordingly, the first sampling signal may be output through the first output node ON1. As such, the second and third capacitors C2 and C3, the first gain capacitor CS1, and the amplifier circuit AMPC may function as a z to −z transformed SC integrator, for example, a high pass filter, for the first input signal.

Similarly, a current path (p) flowing from the second input node IN2 to the eighth capacitor C8 through the second input capacitors CIN2 may be formed. A current path (q) flowing from the seventh capacitor C7 to the second output node ON2 through the eighth capacitor C8 may be formed. Accordingly, the eighth capacitor C8 may integrate charges of the seventh capacitor C7 together with the second input signal. In addition, a current path (r) may be formed, and the second gain capacitor CS2 may integrate the second input signal. Accordingly, the second sampling signal may be output through the second output node ON2. As such, the seventh and eighth capacitors C7 and C8, the second gain capacitor CS2, and the amplifier circuit AMPC may function as a z to −z transformed SC integrator, for example, a high pass filter, for the second input signal.

Returning to FIG. 15, in the second time period T2, the control signals P1 and PS1 may be enabled to the high level. The first and second input capacitors CIN1 and CIN2 and the first and second gain capacitors CS1 and CS2 may be initialized.

The second cycle CYC2 may include a third time period T3 and a fourth time period T4. In the second cycle CYC2, the control signal PS4 may be enabled to the high level. The third period CYC3 may include a fifth time period T5 and a sixth time period T6. In the third cycle CYC3, as in the first cycle CYC1, the control signal PS3 may be enabled to the high level. Hereinafter, for convenience of description, the third cycle CYC3 is described prior to the second cycle CYC2.

In the fifth time period T5, the control signals PDS1, P2, PS3, and PS7 may have the high level. Switches receiving the high-level control signals PDS1, P2, PS3, and PS7 may be turned on.

Referring to FIG. 17, a current path (s) flowing from the first input node IN1 to the first output node ON1 through the first input capacitors CIN1 and the second capacitor C2 may be formed. A current path (t) flowing from the third capacitor C3 to the second capacitor C2 may be formed. Accordingly, the second capacitor C2 may integrate charges of the third capacitor C3 together with the first input signal. As such, the second and third capacitors C2 and C3 may perform integration on the first input signal alternately in the first and fifth time periods T1 and T5, and each of the second and third capacitors C2 and C3 may perform integration on the first input signal together with charges stored in the other capacitor when performing the integration. In addition, a current path (u) may be formed, and the first gain capacitor CS1 may integrate the first input signal. As such, the second and third capacitors C2 and C3, the first gain capacitor CS1, and the amplifier circuit AMPC may function as a z to −z transformed SC integrator, for example, a high pass filter, for the first input signal, and the first sampling signal may be output through the first output node ON1.

Similarly, a current path (v) flowing from the second input node IN2 to the second output node ON2 through the second input capacitors CIN2 and the seventh capacitor C7 may be formed. A current path (w) flowing from the eighth capacitor C8 to the seventh capacitor C7 may be formed. Accordingly, the seventh capacitor C7 may integrate charges of the eighth capacitor C8 together with the second input signal. As such, the seventh and eighth capacitors C7 and C8 may perform integration on the second input signal alternately in the first and fifth time periods T1 and T5, and each of the seventh and eighth capacitors C7 and C8 may perform integration on the second input signal together with charges stored in the other capacitor when performing the integration. Also, a current path (x) may be formed, and the second gain capacitor CS2 may integrate the second input signal. As such, the seventh and eighth capacitors C7 and C8, the second gain capacitor CS2, and the amplifier circuit AMPC may function as a z to −z transformed SC integrator, for example, a high pass filter, for the second input signal, and the second sampling signal may be output through the second output node ON2.

Returning to FIG. 15, in the sixth time period T6, the control signals P1 and PS1 may be enabled to the high level. The first and second input capacitors CIN1 and CIN2 and the first and second gain capacitors CS1 and CS2 may be initialized.

In the third time period T3 of the second cycle CYC2, the control signals P2, PS4, and PS6 may have the high level. Switches receiving the high-level control signals P2, PS4, and PS6 may be turned on.

Referring to FIG. 18, a current path (y) flowing from the first input node IN1 to the fifth capacitor C5 may be formed. A current path (z) flowing from the fourth capacitor C4 to the first output node ON1 through the fifth capacitor C5 may be formed. Accordingly, the fifth capacitor C5 may integrate charges of the fourth capacitor C4 together with the first input signal. In addition, a current path (aa) may be formed, and the first gain capacitor CS1 may integrate the first input signal. As such, the fourth and fifth capacitors C4 and C5, the first gain capacitor CS1, and the amplifier circuit AMPC may function as a z to −z transformed SC integrator, for example, a high pass filter, for the first input signal, and the first sampling signal may be output through the first output node ON1.

A current path (bb) flowing from the second input node IN2 to the tenth capacitor C10 may be formed. A current path (cc) flowing from the ninth capacitor C9 to the second output node ON2 through the tenth capacitor C10 may be formed. Accordingly, the tenth capacitor C10 may integrate charges of the ninth capacitor C9 together with the second input signal. In addition, a current path (dd) may be formed, and the second gain capacitor CS2 may integrate the second input signal. As such, the ninth and tenth capacitors C9 and C10, the second gain capacitor CS2, and the amplifier circuit AMPC may function as a z to −z transformed SC integrator, for example, a high pass filter, for the second input signal, and the second sampling signal may be output through the second output node ON2.

Returning to FIG. 15, in the fourth time period T4, the control signals P1 and PS1 may be enabled to the high level. The first and second input capacitors CIN1 and CIN2 and the first and second gain capacitors CS1 and CS2 may be initialized.

The fourth cycle CYC4 may include a seventh time period T7 and an eighth time period T8. As in the second cycle CYC2, the control signal PS4 may be enabled to the high level.

In the seventh time period T7, the control signals P2, PS4 and PS8 may have the high level. Switches receiving the high-level control signals P2, PS4, and PS8 may be turned on.

Referring to FIG. 19, a current path (ee) flowing from the first input node IN1 to the first output node ON1 through the fourth capacitor C4 may be formed. A current path (ff) flowing from the fifth capacitor C5 to the fourth capacitor C4 may be formed. Accordingly, the fourth capacitor C4 may integrate charges of the fifth capacitor C5 together with the first input signal. As such, the fourth and fifth capacitors C4 and C5 may perform integration on the first input signal alternately in the third and seventh time periods T3 and T7, and each of the fourth and fifth capacitors C4 and C5 may perform integration on the first input signal together with charges stored in the other capacitor when performing the integration. In addition, a current path (gg) may be formed, and the first gain capacitor CS1 may integrate the first input signal. As such, the fourth and fifth capacitors C4 and C5, the first gain capacitor CS1, and the amplifier circuit AMPC may function as a z to −z transformed SC integrator, for example, a high pass filter, for the first input signal, and the first sampling signal may be output through the first output node ON1.

A current path (hh) flowing from the second input node IN2 to the second output node ON2 through the ninth capacitor C9 may be formed. A current path (ii) flowing from the tenth capacitor C10 to the ninth capacitor C9 may be formed. Accordingly, the ninth capacitor C9 may integrate charges of the tenth capacitor C10 together with the second input signal. As such, the ninth and tenth capacitors C9 and C10 may perform integration on the second input signal alternately in the third and seventh time periods T3 and T7, and each of the ninth and tenth capacitors C9 and C10 may perform integration on the second input signal together with charges stored in the other capacitor when performing the integration. In addition, a current path (jj) may be formed, and the second gain capacitor CS2 may integrate the second input signal. As such, the ninth and tenth capacitors C9 and C10, the second gain capacitor CS2, and the amplifier circuit AMPC may function as a z to −z transformed SC integrator, for example, a high pass filter, for the second input signal, and the second sampling signal may be output through the second output node ON2.

Returning to FIG. 15, in the eighth time period T8, the control signals P1 and PS1 may be enabled to the high level. The first and second input capacitors CIN1 and CIN2 and the first and second gain capacitors CS1 and CS2 may be initialized.

A single-ended mode band-pass filter circuit for filtering the first input signal and a single-ended mode band-pass filter circuit for filtering the second input signal can be implemented by the high pass filters provided as described above. The center frequency of each band pass filter circuit may be fs/4, and the gain value of each band pass filter circuit may be CIN/4CS (here, CIN may be the capacitance of one input capacitor, and CS may be the capacitance of one gain capacitor CS1 or CS2). The Q factor of each band pass filter circuit may be adjusted according to capacitances of the second to fifth capacitors C2 to C5, the seventh to tenth capacitors C7 to C10, and the first and second gain capacitors CS1 and CS2.

Effects according to the embodiments are not limited by the above-described contents. Other advantageous effects may be realized by practicing the inventive concept.

Although specific embodiments and implementations have been described herein, other embodiments and modifications may be derived from the foregoing descriptions. Accordingly, the spirit of the present disclosure is not limited to the foregoing embodiments, but may also be applied to the claims set forth below, various modifications, and equivalents.

What is claimed is:

1. A band pass filter circuit comprising:
an amplifier circuit having a first input terminal to receive a first analog signal, a second input terminal to receive a second analog signal, and first and second output terminals;
a plurality of capacitors; and
switches connected to the plurality of capacitors,
wherein,
the switches are controlled in a first switching mode to connect, among the plurality of capacitors, a first group of capacitors between the first and second input terminals and the first and second output terminals, to form in conjunction with the amplifier circuit a first band pass filter that filters the first and second analog signals in a differential mode, and
the switches are controlled in a second switching mode to connect, among the plurality of capacitors, a second group of capacitors between the first input terminal and the first output terminal and a third group of capacitors between the second input terminal and the second output terminal, such that the amplifier circuit, the second group of capacitors, and the third group of capacitors form second band pass filters to filter each of the first and second analog signals in a single-ended mode.

2. The band pass filter circuit of claim 1, wherein the second band pass filters are configured to share one or more of the plurality of capacitors with the first band pass filter.

3. The band pass filter circuit of claim 1, wherein at least one of the second group of capacitors and at least one of the third group of capacitors are included in the first group of capacitors.

4. The band pass filter circuit of claim 1, wherein the amplifier circuit and the second group of capacitors are included in one of the second band pass filters to filter the first analog signal, and
the amplifier circuit and the third group of capacitors are included in another one of the second band pass filters to filter the second analog signal.

5. The band pass filter circuit of claim 1, wherein during the first switching mode, the amplifier circuit includes the first input terminal as an inverting input terminal, the second input terminal as a non-inverting input terminal, the first output terminal as a non-inverting output terminal, and the second output terminal as an inverting output terminal.

6. The band pass filter circuit of claim 1, wherein the plurality of capacitors includes:
a first gain capacitor connected between the first input terminal and the first output terminal; and
a second gain capacitor connected between the second input terminal and the second output terminal.

7. The band pass filter circuit of claim 1, further comprising, among the plurality of capacitors:
first input capacitors connected in series to the first input terminal; and
second input capacitors connected in series to the second input terminal,
wherein the first analog signal is transmitted to the first input terminal through the first input capacitors, and
wherein the second analog signal is transmitted to the second input terminal through the second input capacitors.

8. The band pass filter circuit of claim 1, wherein in the second band pass filters,
each of first and second capacitors among the second group of capacitors is configured to alternately perform integration on the first analog signal and output a first sampling signal, and
the first capacitor is connected to the second capacitor through a first connection node when performing the integration on the first analog signal, and is configured to perform integration of charges of the second capacitor together with the first analog signal and output the first sampling signal.

9. The band pass filter circuit of claim 8, wherein in the second band pass filters,
the second capacitor is connected to the first capacitor through the first connection node when performing the integration on the first analog signal, and is configured to perform integration of charges of the first capacitor together with the first analog signal and output the first sampling signal.

10. The band pass filter circuit of claim 8, wherein in the second band pass filters,
each of third and fourth capacitors among the third group of capacitors is configured to alternately perform integration on the second analog signal and output a second sampling signal, and
the third capacitor is connected to the fourth capacitor through a second connection node when performing the integration on the second analog signal, and is configured to perform integration of charges of the fourth capacitor together with the second analog signal and output the second sampling signal.

11. The band pass filter circuit of claim 10, wherein in the second band pass filters,
the fourth capacitor is connected to the third capacitor through the second connection node when performing the integration on the second analog signal, and is configured to perform integration of charges of the third capacitor together with the second analog signal and output the second sampling signal.

12. The band pass filter circuit of claim 1, wherein in the first band pass filter,
a first capacitor among the first group of capacitors is configured to perform integration on the first analog signal and output a first sampling signal through the first output terminal, and
a second capacitor among the first group of capacitors is connected to the first capacitor through a first connection node and configured to store charges of the first capacitor.

13. The band pass filter circuit of claim 12, wherein in the first band pass filter,
when the first capacitor performs the integration on the first analog signal, the second capacitor is connected to a third capacitor among the first group of capacitors through a second connection node, and the third capacitor is configured to perform integration of charges of the second capacitor together with the second analog signal and output a second sampling signal through the second output terminal.

14. A sensor device comprising:
a sensor array; and
a sensor driver including a band pass filter circuit to filter first and second analog signals received from the sensor array,
wherein the band pass filter circuit includes:
an amplifier circuit having a first input terminal receiving the first analog signal, a second input terminal receiving the second analog signal, a first output terminal, and a second output terminal;
a plurality of capacitors; and
switches connected to the plurality of capacitors,
wherein,
the switches are controlled in a first switching mode to connect, among the plurality of capacitors, a first group of capacitors between the first and second input terminals and the first and second output terminals, to form, in conjunction with the amplifier circuit a first band pass filter that filters the first and second analog signals in a differential mode, and
the switches are controlled in a second switching mode to connect, among the plurality of capacitors, a second group of capacitors between the first input terminal and the first output terminal and a third group of capacitors between the second input terminal and the second output terminal, such that the amplifier circuit, the second group of capacitors, and the third group of capacitors form second band pass filters to filter each of the first and second analog signals in a single-ended mode.

15. The sensor device of claim 14, wherein the sensor driver is configured to control the switches to operate the band pass filter circuit as the first band pass filter to sense a touch input of a body based on the first and second analog signals, and
the sensor driver is configured to control the switches to operate the band pass filter circuit as the second band pass filters to sense a touch input of a pen based on the first and second analog signals.

16. The sensor device of claim 14, wherein the second band pass filters are configured to share one or more of the plurality of capacitors with the first band pass filter.

17. The sensor device of claim 14, wherein at least one of the second group of capacitors and at least one of the third group of capacitors are included in the first group of capacitors.

18. The sensor device of claim 14, wherein the amplifier circuit and the second group of capacitors are included in one of the second band pass filters and configured to filter the first analog signal, and
the amplifier circuit and the third group of capacitors are included in another one of the second band pass filters and configured to filter the second analog signal.

19. A switched capacitor integrator circuit for sampling analog input signals, comprising:
an operational amplifier having a first input terminal to receive a first analog signal, a second input terminal to receive a second analog signal, and first and second output terminals;
a plurality of capacitors; and
switches connected to the plurality of capacitors,
wherein, the switches are controlled in a first switching mode to connect, among the plurality of capacitors, a first group of capacitors between the first and second input terminals and the first and second output terminals, to form in conjunction with the operational amplifier a first filter that filters the first and second analog signals in a differential mode, and the switches are controlled in a second switching mode to connect, among the plurality of capacitors, a second group of capacitors between the first input terminal and the first output terminal and a third group of capacitors between the second input terminal and the second output terminal, such that the operational amplifier, the second group of capacitors, and the third group of capacitors form second filters to filter each of the first and second analog signals in a single-ended mode.

20. The switched capacitor integrator of claim 19, wherein the first and second filters are each band pass filters.

* * * * *